(12) United States Patent
Lusetsky et al.

(10) Patent No.: US 9,368,605 B2
(45) Date of Patent: Jun. 14, 2016

(54) SEMICONDUCTOR STRUCTURE INCLUDING A SPLIT GATE NONVOLATILE MEMORY CELL AND A HIGH VOLTAGE TRANSISTOR, AND METHOD FOR THE FORMATION THEREOF

(71) Applicant: GLOBALFOUNDRIES Inc., Grand Cayman (KY)

(72) Inventors: Igor Lusetsky, Dresden (DE); Ralf van Bentum, Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 166 days.

(21) Appl. No.: 14/011,976

(22) Filed: Aug. 28, 2013

(65) Prior Publication Data

US 2015/0060983 A1   Mar. 5, 2015

(51) Int. Cl.

| | |
|---|---|
| *H01L 29/788* | (2006.01) |
| *H01L 27/115* | (2006.01) |
| *H01L 29/66* | (2006.01) |
| *H01L 29/423* | (2006.01) |
| *H01L 29/792* | (2006.01) |
| *H01L 21/28* | (2006.01) |

(52) U.S. Cl.
CPC .... *H01L 29/66825* (2013.01); *H01L 21/28273* (2013.01); *H01L 21/28282* (2013.01); *H01L 27/11546* (2013.01); *H01L 27/11573* (2013.01); *H01L 29/4234* (2013.01); *H01L 29/42324* (2013.01); *H01L 29/66833* (2013.01); *H01L 29/7881* (2013.01); *H01L 29/792* (2013.01)

(58) Field of Classification Search
CPC .................................................. H01L 29/7883
See application file for complete search history.

(56) References Cited

U.S. PATENT DOCUMENTS

| | | | |
|---|---|---|---|
| 7,732,278 B2 | 6/2010 | Prinz et al. | |
| 7,923,769 B2 | 4/2011 | White et al. | |
| 8,173,505 B2 | 5/2012 | Herrick et al. | |
| 8,263,463 B2 | 9/2012 | Kang et al. | |
| 2004/0246780 A1* | 12/2004 | Kawahara et al. | 365/185.28 |
| 2009/0262583 A1* | 10/2009 | Lue | 365/185.28 |
| 2012/0241839 A1 | 9/2012 | White et al. | |
| 2013/0217197 A1* | 8/2013 | Hall | H01L 29/66833 438/287 |
| 2013/0267072 A1* | 10/2013 | Hall et al. | 438/258 |

* cited by examiner

*Primary Examiner* — Thao X Le
*Assistant Examiner* — J. R. Oakley
(74) *Attorney, Agent, or Firm* — Amerson Law Firm, PLLC

(57) ABSTRACT

A semiconductor structure includes a split gate nonvolatile memory cell and a high voltage transistor. The nonvolatile memory cell includes an active region, a nonvolatile memory stack provided above the active region, a control gate electrode provided above the memory stack, a select gate electrode at least partially provided above the active region adjacent to the memory stack and a select gate insulation layer. The high voltage transistor includes an active region, a gate electrode and a gate insulation layer provided between the active region and the gate electrode. The select gate insulation layer of the nonvolatile memory device and the gate insulation layer of the high voltage transistor are at least partially formed of a same high-k dielectric material. The select gate electrode of the nonvolatile memory device and the gate electrode of the high voltage transistor are at least partially formed of a same metal.

14 Claims, 16 Drawing Sheets

SEMICONDUCTOR STRUCTURE INCLUDING A SPLIT GATE NONVOLATILE MEMORY CELL AND A HIGH VOLTAGE TRANSISTOR, AND METHOD FOR THE FORMATION THEREOF

BACKGROUND OF THE INVENTION

1. Field of the Invention

Generally, the present disclosure relates to the field of integrated circuits, and, more particularly, to integrated circuits including nonvolatile memory devices.

2. Description of the Related Art

Nonvolatile memory, such as, for example, flash memory, may be used in various storage devices, such as, for example, secure digital memory cards (SD cards), USB sticks, solid state drives (SSDs), and internal memory of various electronic devices, such as, for example, mobile phones, tablet computers, media players, etc. Further applications of nonvolatile memory include embedded systems, such as microcontrollers, wherein a nonvolatile memory device may be integrated on a same semiconductor structure as other circuitry of a microcontroller, such as, for example, volatile memory, a CPU and/or input/output devices.

Types of nonvolatile memory devices include split gate nonvolatile memory devices, which may provide advantages in reliability and performance over other types of nonvolatile memory, such as, for example, control gate nonvolatile memory.

Split gate nonvolatile memory devices are described, for example, in U.S. Patent Publication No. 2012/0241839 and U.S. Pat. Nos. 7,923,769, 7,732,278, 8,173,505 and 8,263,463.

Split gate nonvolatile memory devices may include a plurality of split gate nonvolatile memory cells, which are typically arranged in an array and are electrically connected to electrically conductive lines extending along columns and rows of the array. The electrically conductive lines may be used for programming, erasing and/or reading the split gate nonvolatile memory cells. Each split gate nonvolatile memory cell may include an active region formed in a semiconductor material, such as, for example, silicon. The active region may include a source region, a drain region and a channel region that is arranged between the source region and the drain region. The channel region may be doped inversely to the doping of the source region and the drain region. For example, the source and drain regions may be N-doped, and the channel region may be provided in a P-well that is provided in the semiconductor material, and may have a P-type doping corresponding to the doping of the P-well.

Above the channel region, a control gate electrode and a select gate electrode may be provided adjacent each other. Between the control gate electrode and the channel region, a nonvolatile memory stack may be provided, and a select gate insulation layer may be provided between the select gate electrode and the channel region. The select gate electrode may be arranged at the drain side of the channel region, and the control gate electrode may be arranged at the source side of the channel region. The nonvolatile memory stack may include a charge storage layer that may include silicon or silicon nitride and is separated from the control gate electrode and the channel region by isolation layers formed of an electrically insulating material, such as silicon dioxide.

Due to the electrical isolation of the charge storage layer that is provided by the isolation layers, electrical charge may be stored for a relatively long time in the charge storage layer, wherein the amount of charge in the charge storage layer may represent data stored in the split gate nonvolatile memory cell.

The select gate electrode and the control gate electrode may be electrically insulated from each other, wherein the electrical insulation between the select gate electrode and the control gate electrode may be provided by a portion of the nonvolatile memory stack, as described, for example, in U.S. Patent Publication No. 2012/0241839 and U.S. Pat. Nos. 7,923,769, 8,173,505 and 8,263,463, or by a sidewall spacer as described in U.S. Pat. No. 7,732,278.

For reading data from the split gate nonvolatile memory cell, the source region may be grounded, and relatively small positive voltages of, for example, about 1 V may be applied to the select gate electrode, the control gate electrode and the drain. The channel region between the source region and the drain region may be influenced by the electrical charges stored at the charge storage layer, so that a current that is representative of the data stored in the split gate nonvolatile memory cell flows between the drain region and source region of the split gate nonvolatile memory cell.

For programming split gate nonvolatile memory cells, a source side injection of charge carriers into the charge storage layer may be performed. For this purpose, the drain region of the split gate nonvolatile memory cell may be grounded, a relatively high positive voltage of, for example, about 4 V may be applied to the source region, and an even higher positive voltage, for example a voltage in a range from about 6-9 V, may be applied to the control gate electrode. A voltage slightly greater than the threshold voltage of the channel region of the split gate nonvolatile memory cell may be applied to the select gate electrode.

The split gate nonvolatile memory cell may be erased by Fowler-Nordheim tunneling. For this purpose, a negative bias may be applied between the control gate electrode and the source and drain regions. For example, a relatively high negative voltage of, for example, about −6 V may be applied to the control gate electrode, and a relatively high positive voltage of, for example, about 6 V may be applied to each of the source region and the drain region. A relatively high positive voltage of, for example, about 5 V may be applied to the select gate electrode.

Known split gate nonvolatile memory devices may have issues associated therewith. For example, in some split gate nonvolatile memory devices, the control gate electrode and the select gate electrode may be provided by polysilicon layers that partially overlap with each other. In this case, any misalignment of these layers may result in decreased performance and yield. Select gate insulation layers formed of silicon dioxide and select gate electrodes formed of polysilicon may provide limited possibilities for reducing the size of the split gate nonvolatile memory cells. Using portions of the nonvolatile memory stack for separating the select gate electrode and the control gate electrode may reduce the possibilities for reducing the size of the split gate nonvolatile memory cells. Moreover, split gate nonvolatile memory cell designs may have issues related to the integration of split gate nonvolatile memory cells with logic transistors that are provided in the same semiconductor structure.

In view of the situation described above, the present disclosure relates to a semiconductor structure and a method for the formation thereof, wherein some or all of the above-mentioned issues are overcome substantially completely or at least partially.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrated semiconductor structure disclosed herein includes a split gate nonvolatile memory cell and a high voltage transistor. The split gate nonvolatile memory cell includes an active region, a nonvolatile memory stack provided above the active region, a control gate electrode provided above the nonvolatile memory stack, a select gate electrode at least partially provided above the active region adjacent to the nonvolatile memory stack, and a select gate insulation layer. The high voltage transistor includes an active region, a gate electrode and a gate insulation layer provided between the active region and the gate electrode. The select gate insulation layer of the split gate nonvolatile memory cell and the gate insulation layer of the high voltage transistor are at least partially formed of a same high-k dielectric material. The select gate electrode of the split gate nonvolatile memory cell and the gate electrode of the high voltage transistor are at least partially formed of a same metal.

An illustrative method disclosed herein includes providing a semiconductor structure. A first well region and a second well region are formed in the semiconductor structure. A nonvolatile memory stack and a control gate electrode are formed above the first well region. After the formation of the nonvolatile memory stack and the control gate electrode, one or more electrically insulating layers are formed over the semiconductor structure. At least one of the electrically insulating layers includes a high-k dielectric material. After the formation of the one or more electrically insulating layers, one or more electrically conductive layers are formed over the semiconductor structure. At least one of the one or more electrically conductive layers includes a metal. A select gate insulation layer and a select gate electrode that are provided at least partially above the first well region are formed adjacent to the nonvolatile memory stack. A transistor gate insulation layer and a transistor gate electrode are formed above the second well region. The select gate insulation layer and the transistor gate insulation layer are at least partially formed from the one or more electrically insulating layers. The select gate electrode and the transistor gate electrode are at least partially formed from the one or more electrically conductive layers.

BRIEF DESCRIPTION OF THE DRAWINGS

The disclosure may be understood by reference to the following description taken in conjunction with the accompanying drawings, in which like reference numerals identify like elements, and in which:

FIGS. 1a-6a show schematic cross-sectional views of a first portion of a semiconductor structure according to an embodiment in stages of a method of manufacturing a semiconductor structure according to an embodiment;

FIGS. 1b-6b show schematic cross-sectional views of a second portion of the semiconductor structure illustrated in FIGS. 1a-6a in the stages of the method of manufacturing the semiconductor structure illustrated in FIGS. 1a-6a;

FIGS. 7b and 8b show schematic cross-sectional views of a second portion of the semiconductor structure illustrated in FIGS. 7a and 8a in the stages of the method of manufacturing the semiconductor structure illustrated in FIGS. 7a and 8a.

Figure 1A:
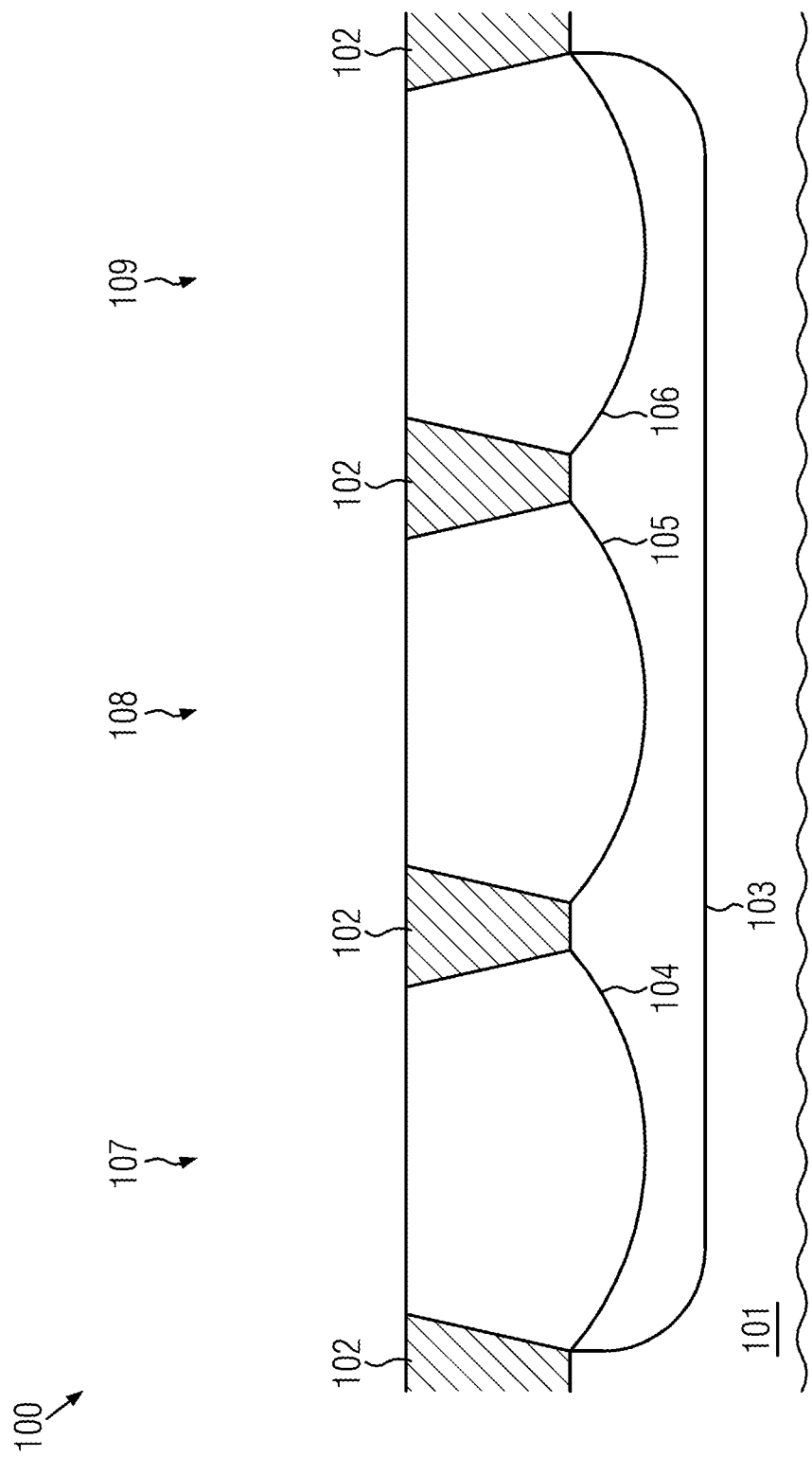

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides embodiments that can allow an integration of the manufacturing of split gate nonvolatile memory devices into process flows for manufacturing logic transistors that include high-k gate insulation layers and metal gate electrodes with a relatively small or substantially no impact on characteristics of the logic transistors. In particular, the control gate electrode and the nonvolatile memory stack of nonvolatile memory cells may be formed prior to the formation of logic transistors, so that processes employed for the formation of the control gate electrode and the nonvolatile memory stack substantially do not affect components of the logic transistors.

Embodiments may provide split gate nonvolatile memory cells having a select gate insulation layer including a high-k dielectric material and a select gate electrode including a metal. The select gate insulation layer and/or the select gate electrode may be formed at least partially by the same process steps as gate insulation layers and gate electrodes of logic transistors, which may also help to reduce the complexity and the costs of the manufacturing process.

In some embodiments, a dielectric material between the control gate electrode and the select gate electrode of the split gate nonvolatile memory cells may be formed by the same process steps as gate insulation layers of logic transistors, and may be scaled and modified in the same way as gate insulation layers of logic transistors. Thus, a way to scale and improve the dielectric material between the control gate electrode and the select gate electrode may be provided.

In some embodiments, high voltage transistors that may, in particular, be used for providing relatively high voltages that are employed for programming and erasing split gate nonvolatile memory cells in the split gate nonvolatile memory device may be formed with a gate insulation layer including a high-k dielectric material and a metal gate electrode, which may help to improve the performance and characteristics of the high voltage transistors. Common process steps may be employed for forming portions of the select gate insulation layer, and gate insulation layers of logic transistors as well as high voltage transistors, and common process steps may be employed for forming select gate electrodes of split gate nonvolatile memory devices as well as gate electrodes of high voltage transistors and logic transistors.

In methods of manufacturing a semiconductor structure according to some embodiments, a dielectric layer, for example a layer of silicon dioxide, from which portions of gate insulation layers of high voltage transistors will be formed in later process steps, may be grown. Thereafter, an etch stop layer, which may, for example, include silicon nitride, may be deposited. Then, the dielectric layer and the etch stop layer may be removed from an area of a split gate nonvolatile memory device, and a bottom isolation layer, a charge storage layer and a top isolation layer of a nonvolatile memory stack may be deposited. The bottom isolation layer and the top isolation layer may include silicon dioxide, and the charge storage layer may include silicon or silicon nitride. In embodiments wherein the charge storage layer includes silicon, after the deposition of the charge storage layer, an annealing step may be performed to form silicon nanocrystals. After the deposition of the top isolation layer, a further annealing process and a deposition of a polysilicon layer may be performed. Thereafter, a hardmask, for example a silicon nitride hardmask, may be deposited.

Then, processes of photolithography and etching may be performed to form a control gate electrode of a split gate nonvolatile memory cell from the polysilicon layer, and to form a nonvolatile memory stack of the nonvolatile memory cell from the bottom isolation layer, the charge storage layer and the top isolation layer. In the etching of the polysilicon layer, the bottom isolation layer, the charge storage layer and/or the top isolation layer, the hardmask may be employed for protecting portions of the layers from which the nonvolatile memory stack and the control gate electrode are to be formed. The etch stop layer may be used for protecting the dielectric layer therebelow from being affected by the etch process, and it may be removed, for example, by means of another etch process wherein a different etch chemistry is employed, after the formation of the nonvolatile memory stack and the control gate electrode.

After the formation of the dielectric layer of the high voltage transistors, the nonvolatile memory stack and the control gate electrode, logic transistors, that may include core transistors as well as input/output transistors, may be formed. Since the logic transistors are formed after the formation of the dielectric layer of the high voltage transistors, the nonvolatile memory stack and the control gate electrode, the logic transistors are not affected by the thermal budget of processes employed for the formation of these features. In the formation of the logic transistors, areas of the split gate nonvolatile memory cell and the high voltage transistors may be covered by a high-k metal gate stack, that may also be employed for the formation of portions of the gate insulation layers and the gate electrodes of high voltage transistors, as well as for the formation of the select gate electrodes of the nonvolatile memory cells.

Using the same process steps, the gate etches of the high voltage transistors and the logic transistors may be performed. The select gate electrode may be formed from the high-k metal gate stack in separate steps of photolithography and etching, which may be helpful for addressing issues related to the limited depth of focus of photolithography and the topology of the nonvolatile memory stack and the control gate electrode. Thereafter, processes in accordance with process flows for forming logic transistors and other components of the semiconductor structure, such as, for example, a formation of interlayer dielectrics, contact structures and electrically conductive lines, may be performed.

Figure 1B:
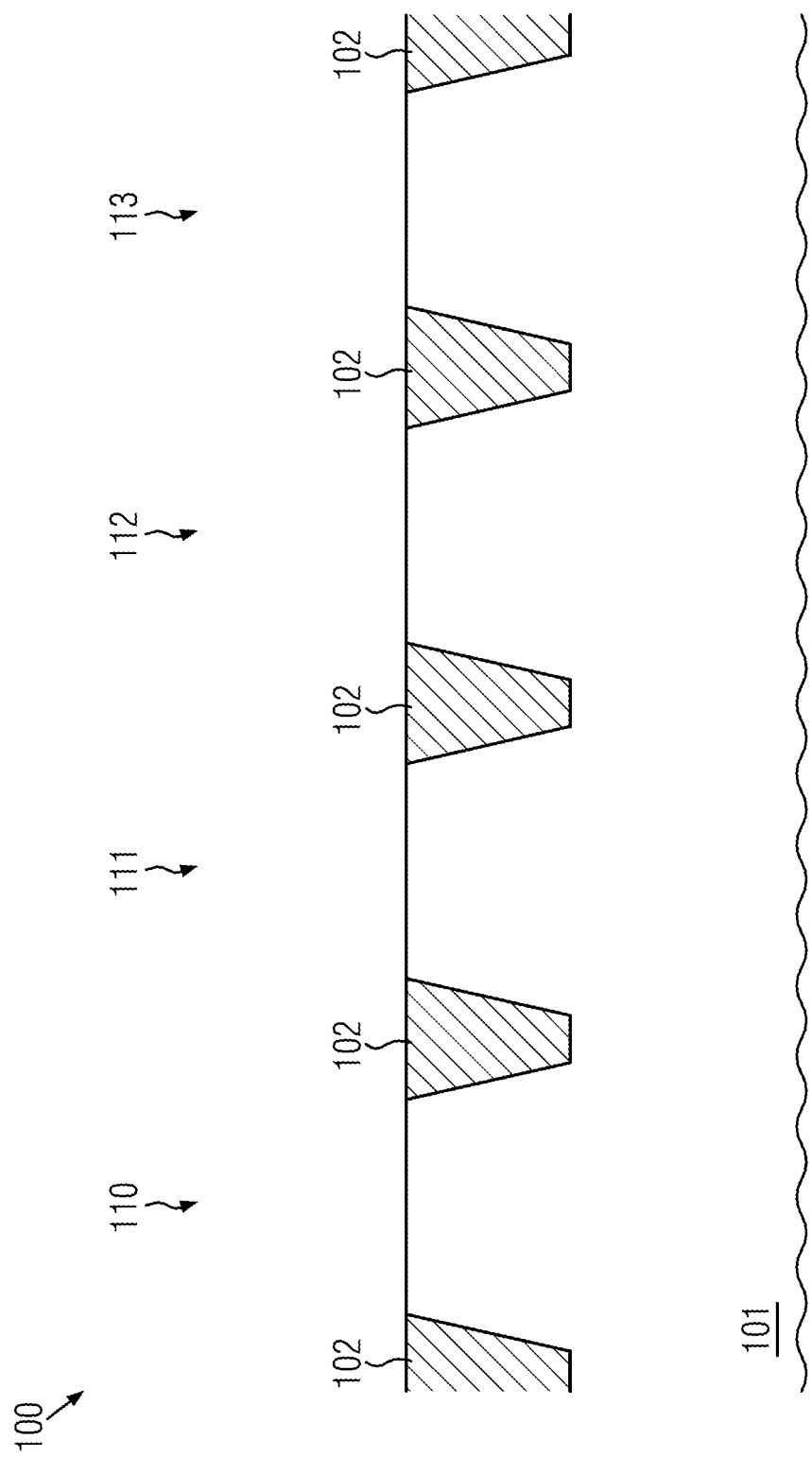

FIGS. 1a and 1b show schematic cross-sectional views of different portions of a semiconductor structure 100 in a stage of a method of manufacturing the semiconductor structure 100. FIGS. 1a and 1b show the portions of the semiconductor structure 100 at the same point of the manufacturing process. Schematic cross-sectional views of the portion of the semiconductor structure 100 shown in FIG. 1a in later stages of the manufacturing process are shown in FIGS. 2a, 3a, 4a, 5a and 6a, and schematic cross-sectional views of the portion of the semiconductor structure 100 shown in FIG. 1b in later stages of the manufacturing process are shown in FIGS. 2b, 3b, 4b, 5b and 6b. Each of FIGS. 1a to 6b is labeled by a number and a letter, wherein figures labeled by the same number show views at the same point of the manufacturing process, and figures labeled by the same letter show the same portion of the semiconductor structure 100.

The semiconductor structure 100 may include a substrate 101. The substrate 101 may be a bulk semiconductor substrate, for example, a silicon wafer or die. In other embodiments, the substrate 101 may be a semiconductor-on-insulator (SOI) substrate including a layer of a semiconductor material, for example a silicon layer, that is provided above a substrate base, for example a silicon wafer or die, and separated therefrom by an electrically insulating layer, for example a silicon dioxide layer. The electrically insulating layer may provide electrical insulation between the semiconductor layer and the substrate base.

As shown in FIG. 1a, the semiconductor structure 100 may include a nonvolatile memory cell area 107, wherein a split gate nonvolatile memory cell will be formed, a high voltage N-channel transistor area 108, wherein a high voltage N-channel transistor will be formed, and a high voltage P-channel transistor area 109, wherein a high voltage P-channel transistor will be formed.

As shown in FIG. 1b, the semiconductor structure 100 may further include a core N-channel transistor area 110 and a core P-channel transistor area 111, wherein a core N-channel transistor and a core P-channel transistor, respectively, of a logic circuit will be formed, and an input/output N-channel transistor area 112 and an input/output P-channel transistor area 113, wherein an input/output N-channel transistor and an input/output P-channel transistor, respectively, of the logic circuit will be formed.

The semiconductor structure 100 may further include a trench isolation structure 102 that may be used for providing electrical insulation between the circuit elements to be formed in the areas 107 to 113, and between these circuit elements and other circuit elements (not shown) of the semiconductor structure 100. The trench isolation structure 102 may be a shallow trench isolation structure including a plurality of trenches formed in the substrate 101 that are filled with an electrically insulating material, for example silicon dioxide.

The semiconductor structure 100 may further include a deep N-well 103 that includes the nonvolatile memory cell area 107, the high voltage N-channel transistor area 108 and the high voltage P-channel transistor area 109. The deep N-well 103 may be doped with an N-type dopant such as, for example, arsenic.

In the nonvolatile memory cell area 107, a nonvolatile memory cell well 104 may be provided. In some embodiments, the nonvolatile memory cell well 104 may be doped with a P-type dopant such as, for example, boron. In the high voltage N-channel transistor area 108, a high voltage P-well 105 that is doped with a P-type dopant may be provided, and a high voltage N-well 106 that is doped with an N-type dopant may be provided in the high voltage P-channel transistor area 109.

At the stage of the manufacturing process illustrated in FIGS. 1a and 1b, the areas 110 to 113 wherein transistors of the logic circuit are to be formed may be substantially undoped, or they may be doped in accordance with the original doping of the substrate 101.

The above-described features may be formed as follows.

The trench isolation structure 102 may be formed by means of techniques for forming shallow trench isolation structures, including processes of photolithography and etching for forming trenches in the substrate 101, and processes of oxidation, deposition and/or polishing for filling the trenches with an electrical insulating material, such as silicon dioxide, and for removing portions of the electrically insulating material outside the trenches. The deep N-well 103 may be formed by means of an ion implantation process, wherein the semiconductor structure 100 is irradiated with ions of an N-type dopant. Portions of the semiconductor structure 100 wherein no deep N-well is to be formed, such as, for example, the areas 110 to 113 shown in FIG. 1b, may be covered by a mask, for example, a photoresist mask, that absorbs ions, so that portions below the photoresist mask are protected from being irradiated with ions.

The nonvolatile memory cell well 104 and the high voltage P-well 105 may be formed by means of one or more ion implantation processes wherein the semiconductor structure 100 is irradiated with ions of a P-type dopant. In some embodiments, the nonvolatile memory cell well 104 and the high voltage P-well 105 may be formed in a common ion implantation process. In other embodiments, separate ion implantation processes may be employed for providing different dopant concentrations and/or different depths of the nonvolatile memory cell well 104 and the high voltage P-well 105. The high voltage N-well 106 may be formed by means of an ion implantation process wherein the semiconductor structure 100 is irradiated with ions of an N-type dopant.

Similar to the ion implantation process employed for forming the deep N-well 103, in the ion implantation processes performed for forming the nonvolatile memory cell well 104, the high voltage P-well 105 and the high voltage N-well 106, portions of the semiconductor structure 100 wherein no ions are to be implanted may be covered by a mask, for example, a photoresist mask.

The present disclosure is not limited to embodiments wherein the nonvolatile memory cell well 104, the high voltage P-well 105 and the high voltage N-well 106 are formed at the stage of the manufacturing process shown in FIGS. 1a and 1b. In other embodiments, the nonvolatile memory cell well 104, the high voltage P-well 105 and the high voltage N-well 106 may be formed at a later stage of the manufacturing process, as will be described below.

Figure 2A:
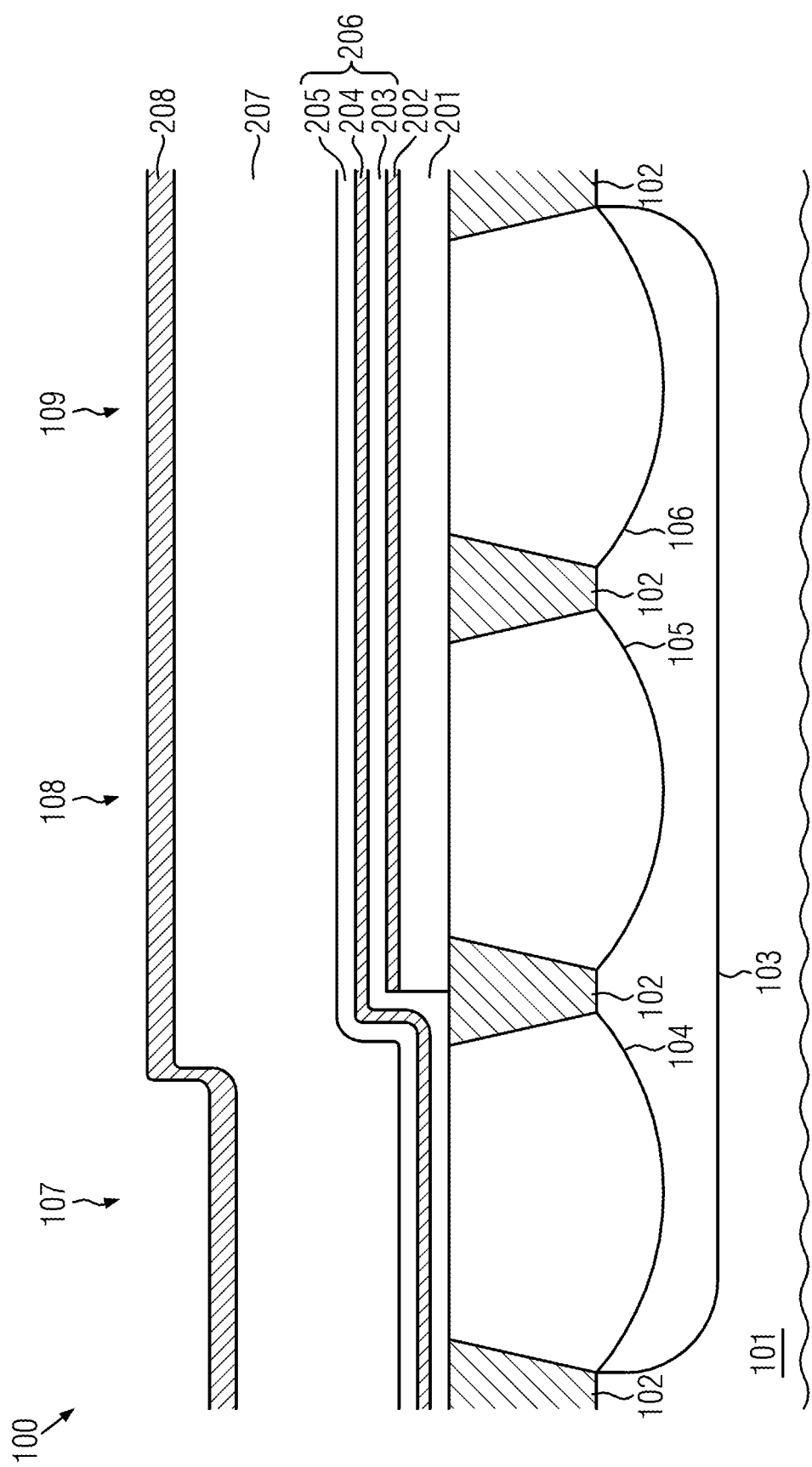
Figure 2B:
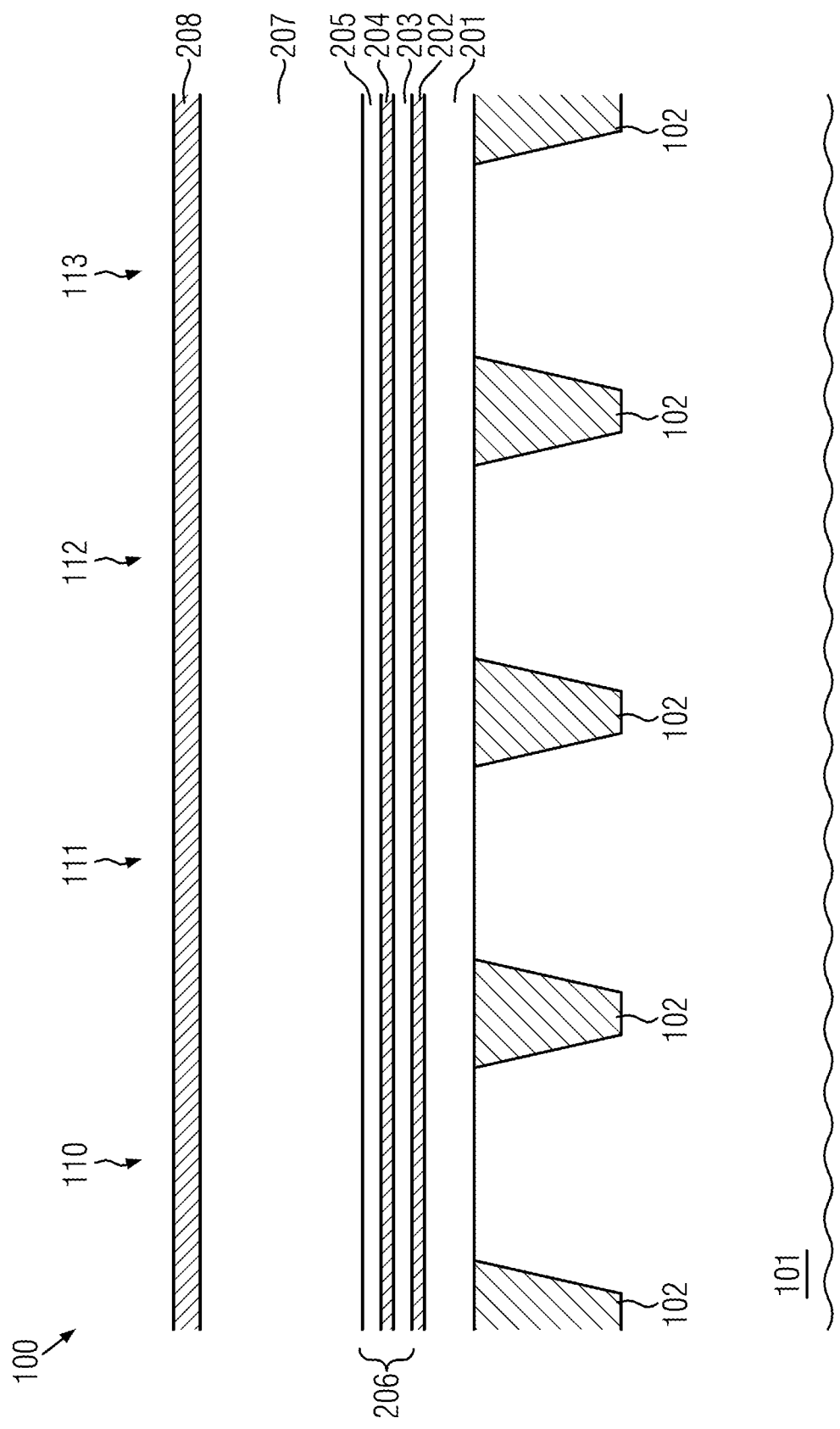

FIGS. 2a and 2b show schematic cross-sectional views of portions of the semiconductor structure 100 at a later stage of the manufacturing process. A dielectric layer 201 may be formed over the semiconductor structure 100, wherein portions of the dielectric layer 201 may be provided directly on the semiconductor material of the transistor areas 108 to 113. On the dielectric layer 201, an etch stop layer 202 may be formed. The etch stop layer 202 may include a material having different etch characteristics than the material of the dielectric layer 201, so that the material of the dielectric layer 201 may be etched selectively with respect to the material of the etch stop layer 202, and the material of the etch stop layer 202 may be etched selectively with respect to the material of the dielectric layer 201. In some embodiments, the dielectric layer 201 may include silicon dioxide and the etch stop layer 202 may include silicon nitride.

In embodiments wherein the nonvolatile memory cell well 104 is not formed before the formation of the dielectric layer 201 and the etch stop layer 202, an ion implantation process for forming the nonvolatile memory cell well 104 may be performed, for example, after the formation of the dielectric layer 201 and before the formation of the etch stop layer 202.

The dielectric layer 201 may be formed by means of known deposition techniques, such as chemical vapor deposition and/or plasma enhanced chemical vapor deposition. In embodiments wherein the dielectric layer 201 includes silicon dioxide, and the substrate 101 includes silicon, the dielectric layer 201, or portions thereof, may alternatively be formed by techniques of oxidation such as, for example, a high temperature processing of the semiconductor structure 100 that is performed in an oxidizing ambient.

After the formation of the etch stop layer 202, a mask, for example a photoresist mask, (not shown) may be formed over the semiconductor structure 100 using techniques of photolithography. The mask may cover the transistor areas 108 to 113, but not the nonvolatile memory cell area 107, so that portions of the etch stop layer 202 formed over the nonvolatile memory cell area 107 are exposed at the surface of the semiconductor structure 100.

Then, one or more etch processes adapted for removing the materials of the dielectric layer 201 and the etch stop layer 202 may be performed for exposing the semiconductor material of the nonvolatile memory cell area 107. Portions of the dielectric layer 201 and the etch stop layer 202 over the transistor areas 108 to 113 may be protected by the mask during the one or more etch processes, so that they are not removed and remain in the semiconductor structure 100. Thereafter, the mask may be removed, for example, by means of a resist strip process.

Then, a nonvolatile memory stack 206 may be formed over the semiconductor structure 100. The nonvolatile memory stack 206 may include a bottom isolation layer 203, a charge storage layer 204 that is provided on the bottom isolation layer 203 and a top isolation layer 205 that is provided on the charge storage layer 204. The bottom isolation layer 203 and the top isolation layer 205 may include an electrically insulating material such as, for example, silicon dioxide. The charge storage layer 204 may include an electrically insulating material that is different from the material of the bottom isolation layer 203 and the top isolation layer 205. In embodiments wherein the bottom isolation layer 203 and the top isolation layer 205 include silicon dioxide, the charge storage layer 204 may include silicon nitride. However, the charge storage layer 204 need not include an electrically insulating material. In other embodiments, the charge storage layer 204 may include silicon, wherein the silicon may, for example, be provided in the form of silicon nanocrystals.

The bottom isolation layer 203, the charge storage layer 204 and the top isolation layer 205 of the nonvolatile memory stack 206 may be formed by means of deposition processes such as, for example, chemical vapor deposition, plasma enhanced chemical vapor deposition and/or physical vapor deposition. In some embodiments, the formation of the bottom isolation layer 203 may, additionally or alternatively to a deposition process, include an oxidation process. In embodiments wherein the charge storage layer 204 includes silicon, the formation of the charge storage layer 204 may include an annealing process in addition to a deposition process. For example, a layer of amorphous silicon may be deposited on the bottom isolation layer 203, and an annealing process may be performed for forming nanocrystalline silicon from the amorphous silicon.

After the formation of the top isolation layer 205, an annealing process may be performed for improving a quality of an interface between the charge storage layer 204 and the top isolation layer 205, which may be particularly helpful in embodiments wherein the charge storage layer 204 includes nanocrystalline silicon.

On the nonvolatile memory stack 206, a layer 207 of a control gate material may be deposited. In some embodiments, the control gate material 207 may include polycrystalline silicon and may be formed by means of techniques of chemical vapor deposition and/or plasma enhanced chemical vapor deposition. The polycrystalline silicon of the layer 207 may be doped for improving the electrical conductivity of the material.

On the layer 207 of control gate material, a layer 208 of a hardmask material, for example a layer of silicon nitride, may be deposited, for example, by means of chemical vapor deposition and/or plasma enhanced chemical vapor deposition.

Figure 3A:
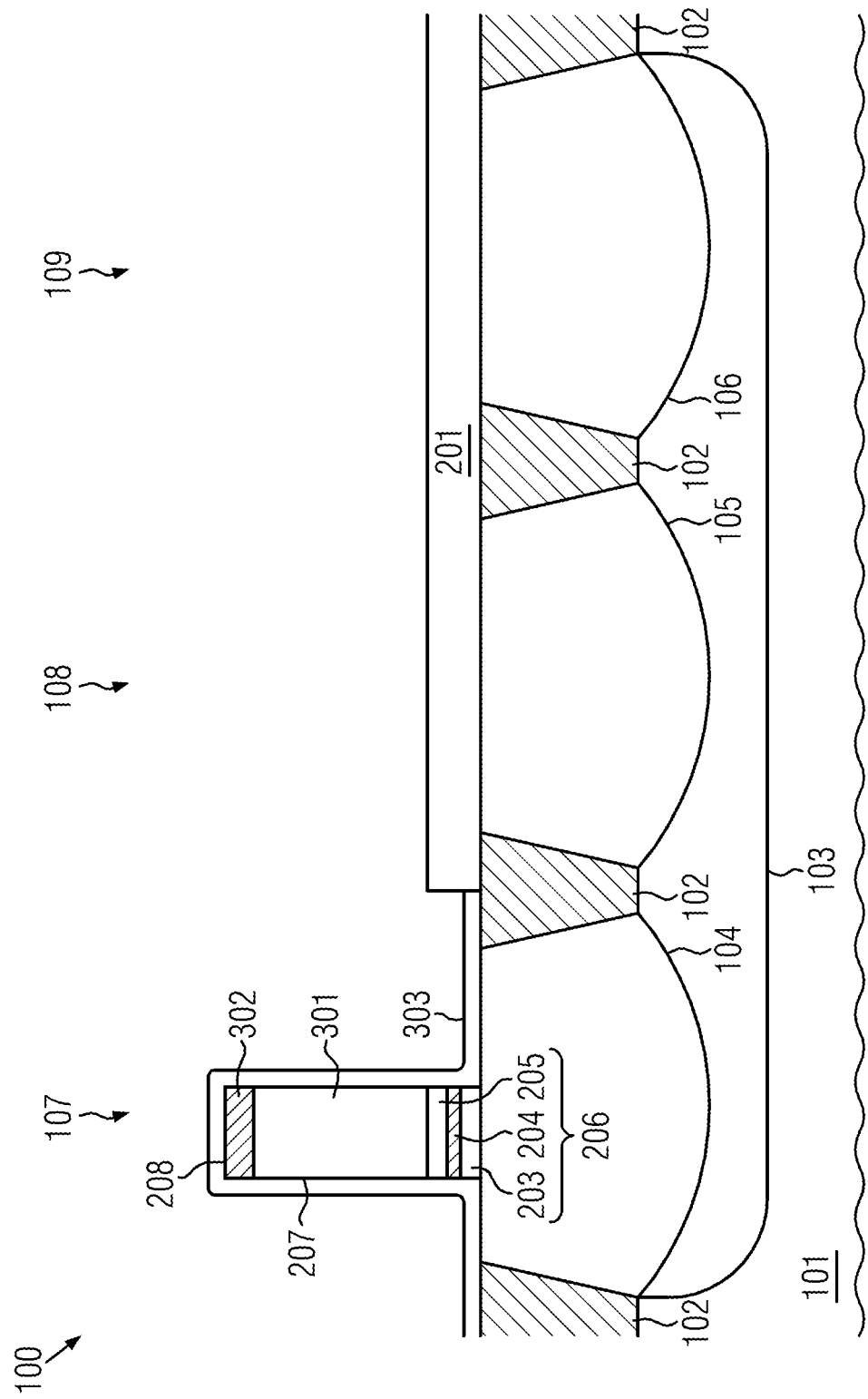
Figure 3B:
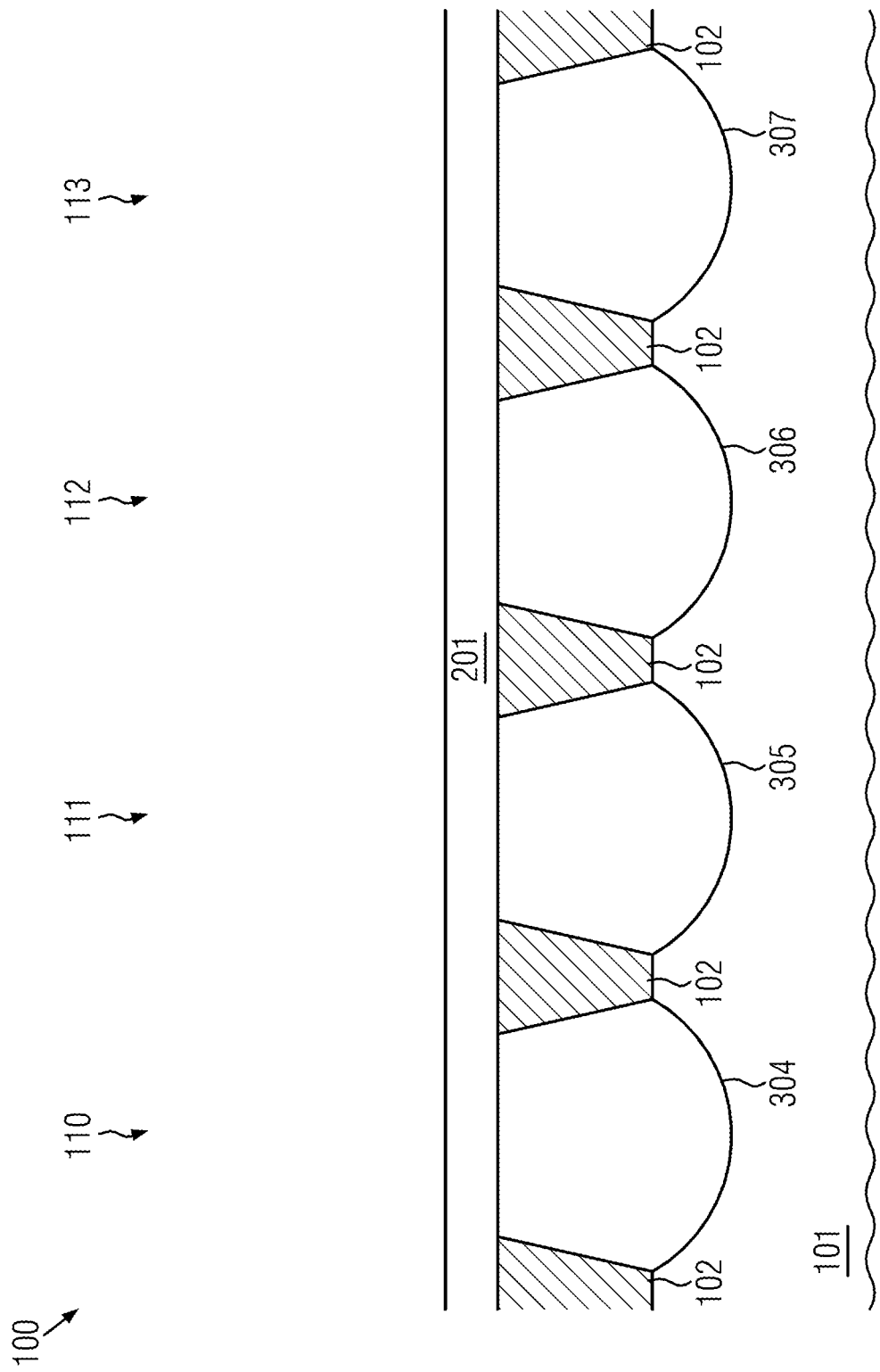

FIGS. 3a and 3b show schematic cross-sectional views of the semiconductor structure 100 in a later stage of the manufacturing process. After the formation of the nonvolatile memory stack 206, the layer 207 of control gate material and the layer 208 of hardmask material, the layer of hardmask material may be patterned by means of techniques of photolithography and etching to form a hardmask at a location at which a control gate electrode 301 is to be provided in the nonvolatile memory cell area 107. Then, one or more etch processes may be performed for removing portions of the layer 207 of control gate material and the nonvolatile memory stack 206 that are not covered by the hardmask. In doing so, the control gate electrode 301 is formed. A portion of the nonvolatile memory stack 206 between the control gate electrode 301 and the nonvolatile memory cell well 104 remains in the semiconductor structure 100. Additionally, the hardmask 208 may remain in the semiconductor structure 100 and may provide a cap layer 302 of the control gate electrode 301.

In the one or more etch processes that are performed for forming the control gate electrode 301 and portions of the nonvolatile memory stack 206 other than those below the control gate electrode 301, the etch stop layer 202 may protect the dielectric layer 201 from being affected by etchants used for etching the control gate electrode 301 and the nonvolatile memory stack 206, in particular from an etchant used for removing the bottom isolation layer 203 of the nonvolatile memory stack 206, which, in some embodiments, may be formed of substantially the same material (for example, silicon dioxide) as the dielectric layer 201.

After these etch processes, an oxidation process may be performed for forming a dielectric layer 303. The dielectric layer 303 may cover the control gate electrode 301 and portions of the nonvolatile memory cell well 104 adjacent the control gate electrode 301. The dielectric layer 303 may be formed by means of an oxidation process wherein a high temperature processing of the semiconductor structure 100 is performed in an oxidizing ambient. In the oxidation process, portions of the polysilicon of the control gate electrode 301 and the silicon semiconductor material of the nonvolatile memory cell well 104 may react chemically with the oxidizing ambient, wherein silicon dioxide is formed.

Then, the etch stop layer 202 may be removed, which may be done by means of an etch process adapted to selectively remove the material of the etch stop layer 202 relative to the materials of the dielectric layer 201 and the dielectric layer 303.

After the removal of the etch stop layer 202, a core transistor P-well 304 may be formed in the core N-channel transistor area 110, a core transistor N-well 305 may be formed in the core P-channel transistor area 111, an input/output transistor P-well 306 may be formed in the input/output N-channel transistor area 112, and an input/output transistor N-well 307 may be formed in the input/output P-channel transistor area 113.

The wells 304, 305, 306, 307 may be formed by means of a plurality of ion implantation processes. In each implantation process, portions of the semiconductor structure 100 wherein no ions are to be implanted may be covered by a mask, for example, a photoresist mask. In particular, the nonvolatile memory cell area 107, the high voltage N-channel transistor area 108 and the high voltage P-channel transistor area 109 may be covered by a mask.

In some embodiments, separate ion implantation processes may be performed for introducing dopants into the core transistor P-well 304 and the input/output transistor P-well 306, respectively, and separate ion implantation processes may be performed for introducing dopants into the core transistor N-well 305 and the input/output transistor N-well 307, respectively. Thus, different dopant concentrations and/or different depths of the wells 304, 305, 306, 307 may be provided in core transistors and input/output transistors of the same type (P-channel and N-channel, respectively).

In other embodiments, the core transistor P-well 304 and the input/output transistor P-well 306 may be formed in a common ion implantation process, and the core transistor N-well 305 and the input/output transistor N-well 307 may be formed in a common ion implantation process. This may allow a reduction in the number of photolithography and ion implantation processes that are required in the formation of the semiconductor structure 100.

In embodiments wherein the high voltage P-well 105 and the high voltage N-well 106 are not formed before the formation of the dielectric layer 201, as described above, the high voltage P-well 105 and the high voltage N-well 106 may also be formed after the removal of the etch stop layer 202. Furthermore, one or more ion implantation processes for adjusting the threshold voltage of transistors in static random access memory (SRAM) areas (not shown) of the semiconductor structure 100 may be performed at this stage of the manufacturing process.

Figure 4A:
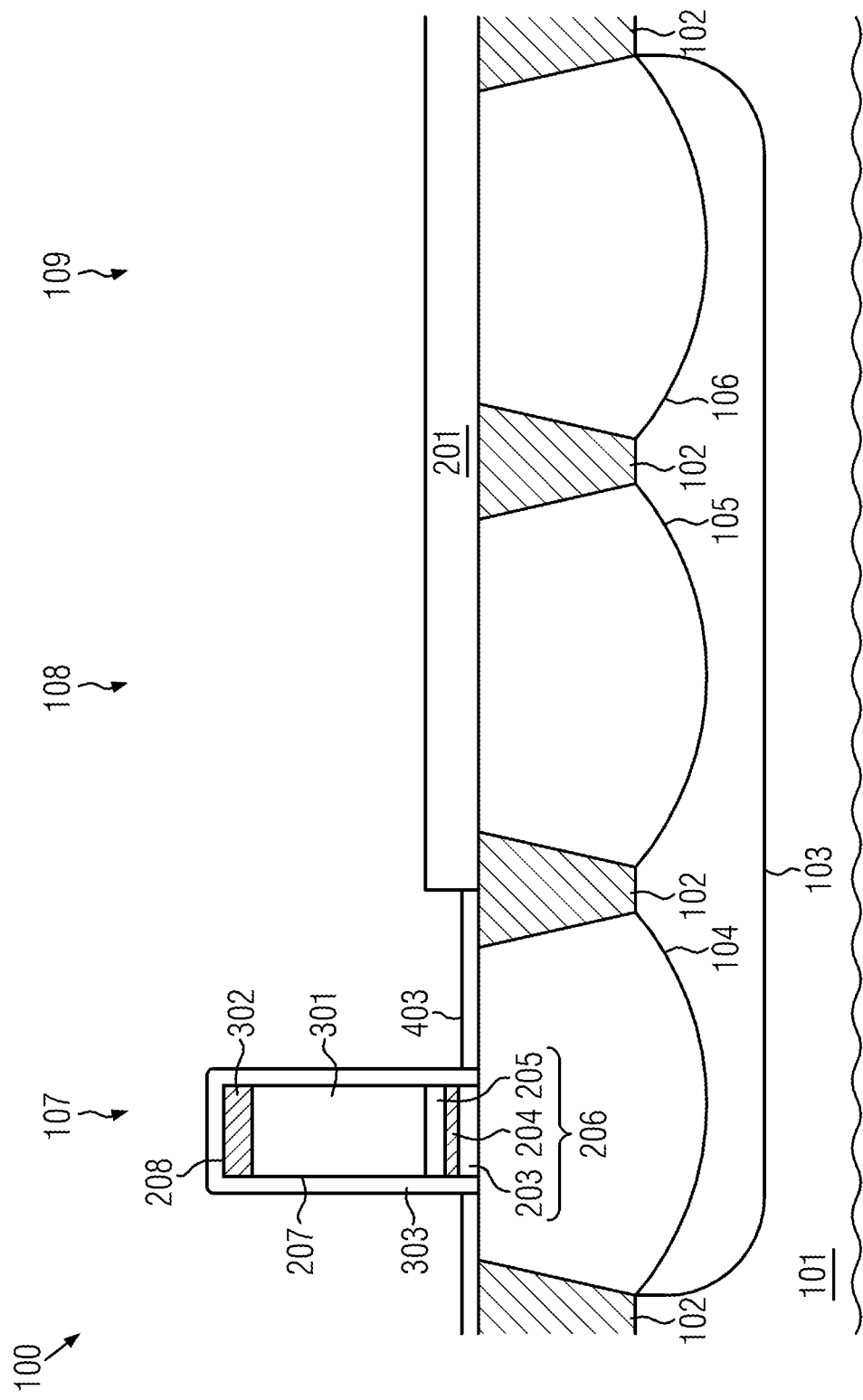
Figure 4B:
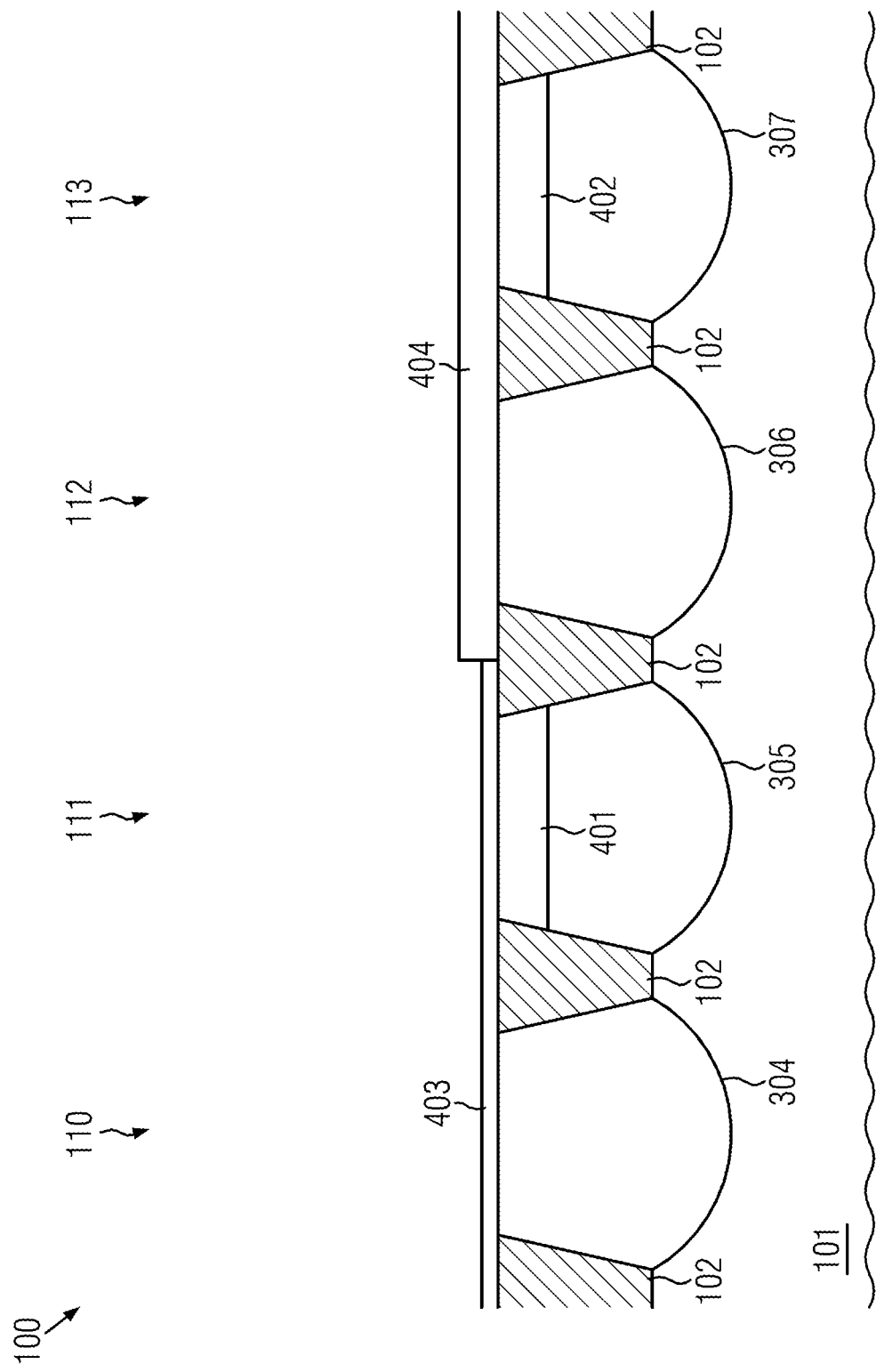

FIGS. 4a and 4b show schematic cross-sectional views of the semiconductor structure 100 at a later stage of the manufacturing process. Layers 401, 402 of a stress-creating material may be provided in the core P-channel transistor area 111 and the input/output P-channel transistor area 113, respectively. The layers 401, 402 of stress-creating material may be formed of a material having a greater lattice constant than the semiconductor material of the substrate 101. In embodiments wherein the substrate includes silicon, the layers 401, 402 of stress-creating material may include silicon/germanium. Due to the greater lattice constant of the material of the layers 401, 402 of stress-creating material, a compressive stress may be formed in the layers 401, 402 of stress-creating material, which may help to improve the mobility of holes in the channel regions of the P-channel transistors to be formed in the core P-channel transistor area 111 and the input/output P-channel transistor area 113.

For forming the layers 401, 402 of stress-creating material, a mask (not shown), for example a photoresist mask covering portions of the semiconductor structure 100 other than the core P-channel transistor area 111 and the input/output P-channel transistor area 113, may be formed, for example, by means of photolithography. Then, an etch process adapted to remove the material of the dielectric layer 201 may be performed to expose the semiconductor material of the substrate 101 in the core P-channel transistor area 111 and the input/output P-channel transistor area 113. Then, an etch process adapted to remove the semiconductor material of the substrate 101 may be performed to form recesses in the core P-channel transistor area 111 and the input/output P-channel transistor area 113. The mask may be removed, and a selective epitaxial growth process may be performed for selectively depositing the layers 401, 402 of stress-creating material on the exposed semiconductor material of the core P-channel transistor area 111 and the input/output P-channel transistor area 113. The selective epitaxial growth process employed for depositing the material of the layers 401, 402 of stress-creating material may be adapted such that substantially no deposition of material is obtained on the dielectric layers 201, 303, or only a small amount of material is deposited on the dielectric layers 201, 303. The selective epitaxial growth process may include a chemical vapor deposition process, a plasma enhanced chemical vapor deposition process and/or physical vapor deposition process adapted for selective epitaxial deposition of silicon/germanium.

After the formation of the layers 401, 402 of stress-creating material, the dielectric layer 201 may be removed from the core N-channel transistor area 110 and the input/output N-channel transistor area 112. In some embodiments, the dielectric layer 303, or at least portions thereof, may be removed from the nonvolatile memory cell area 107. For example, portions of the dielectric layer 303 may be removed from portions of the nonvolatile memory cell well 104 adjacent the control gate electrode 301, whereas portions of the dielectric layer 303 on the control gate electrode 301 may remain in the semiconductor structure. For removing the dielectric layer 303 or portions thereof, a mask, for example, a photoresist mask, may be formed that covers the high voltage N-channel transistor area 108 and the high voltage P-channel transistor area 109, wherein the mask does not cover those portions of the semiconductor structure 100 from which the dielectric layer 201 and, optionally, the dielectric layer 303 are to be removed. Then, an etch process may be performed for removing the dielectric material of the layers 201, 303, for example, an etch process adapted to remove silicon dioxide.

Thereafter, dielectric layers 403, 404 may be formed, wherein the dielectric layer 403 may cover portions of the nonvolatile memory cell well 104 adjacent the control gate electrode 301, the core transistor P-well 304 and the core transistor N-well 305. The dielectric layer 404 may cover the input/output transistor P-well 306 and the input/output transistor N-well 307.

For forming the dielectric layers 403, 404, a first oxidation process may be performed wherein portions of the material of the substrate 101 exposed at the surface of the semiconductor structure 100 are oxidized. Then, a mask covering portions of the semiconductor structure 100 other than the core N-channel transistor area 110, the core P-channel transistor area 111 and the nonvolatile memory cell area 107 may be formed by means of a photolithography process. Then, an etch process for removing portions of the dielectric layer 403 from the nonvolatile memory cell area 107, the core N-channel transistor area 110 and the core P-channel transistor area 111 may be performed. Thereafter, a further oxidation process may be performed for forming the dielectric layer 403. As an alternative to forming the dielectric layers 403, 404 by means of an oxidation process, one or both of the layers 403, 404 may be formed by means of a deposition process such as chemical vapor deposition and/or plasma-enhanced chemical vapor deposition.

At the stage of the manufacturing process shown in FIGS. 4a and 4b, the nonvolatile memory cell area 107, the core N-channel transistor area 110 and the core P-channel transistor area 111 may be covered with the dielectric layer 403, the input/output N-channel transistor area 112 and the input/output P-channel transistor area 113 may be covered by the dielectric layer 404, and the high voltage N-channel transistor area 108 and the high voltage P-channel transistor area 109 may be covered by the dielectric layer 201. The dielectric layers 201, 403, 404 may be formed of substantially the same material, for example, silicon dioxide. However, the dielectric layers 201, 403, 404 may have different thicknesses. In particular, the dielectric layer 201 may be thicker than the dielectric layer 404, and the dielectric layer 404 may be thicker than the dielectric layer 403.

As will be explained in more detail below, the dielectric layers 201, 403, 404 may be used for forming portions of a gate insulation layer of transistors formed in the areas 108 to 113. Thus, by providing dielectric layers 201, 403, 404 having different thicknesses, gate insulation layers having a different thickness may be formed, in accordance with operating voltages of the respective transistors. In the high voltage N-channel transistor area 108 and the high voltage P-channel transistor area 109, high voltage transistors that may be used for providing voltages employed for programming and erasing the nonvolatile memory cell to be formed in the nonvolatile memory cell area 107 may be formed, wherein the voltage applied in the programming and erasing of the memory cell may be greater than voltages of operation of the logic transistors formed in the transistor areas 110 to 113. The input/output transistors formed in areas 112, 113 may have a greater voltage of operation than the core transistors formed in transistor areas 110, 111. A greater thickness of the respective dielectric layer may be helpful for providing a gate insulation layer that has a breakthrough voltage that is greater than the voltage of operation of the respective transistor.

In some embodiments, the dielectric layer 201 may have a thickness in a range from about 100-260 Å. The dielectric layer 403 may have a thickness in a range from about 20-30 Å, and the dielectric layer 404 may have a thickness in a range from about 60-80 Å.

Figure 5A:
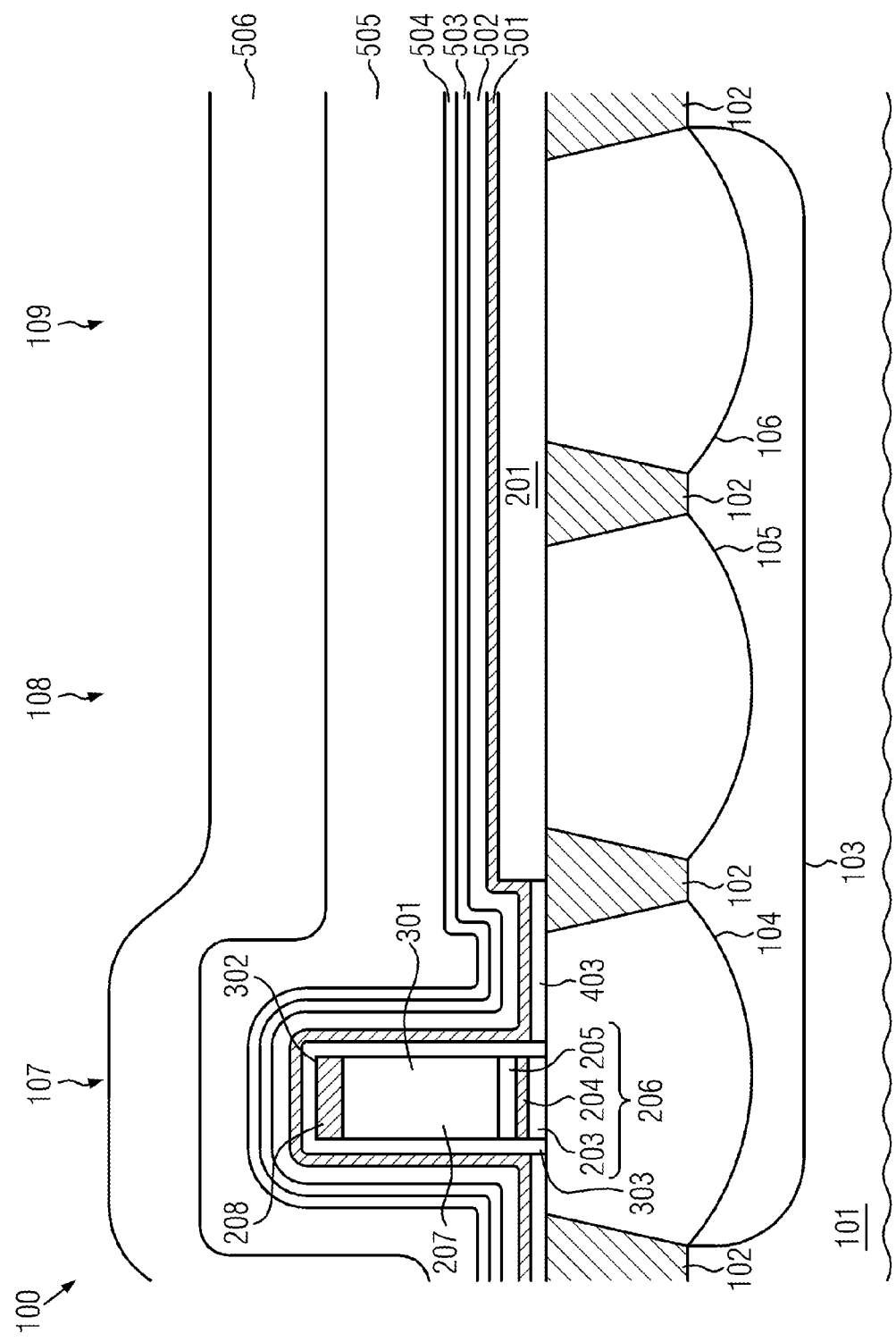
Figure 5B:
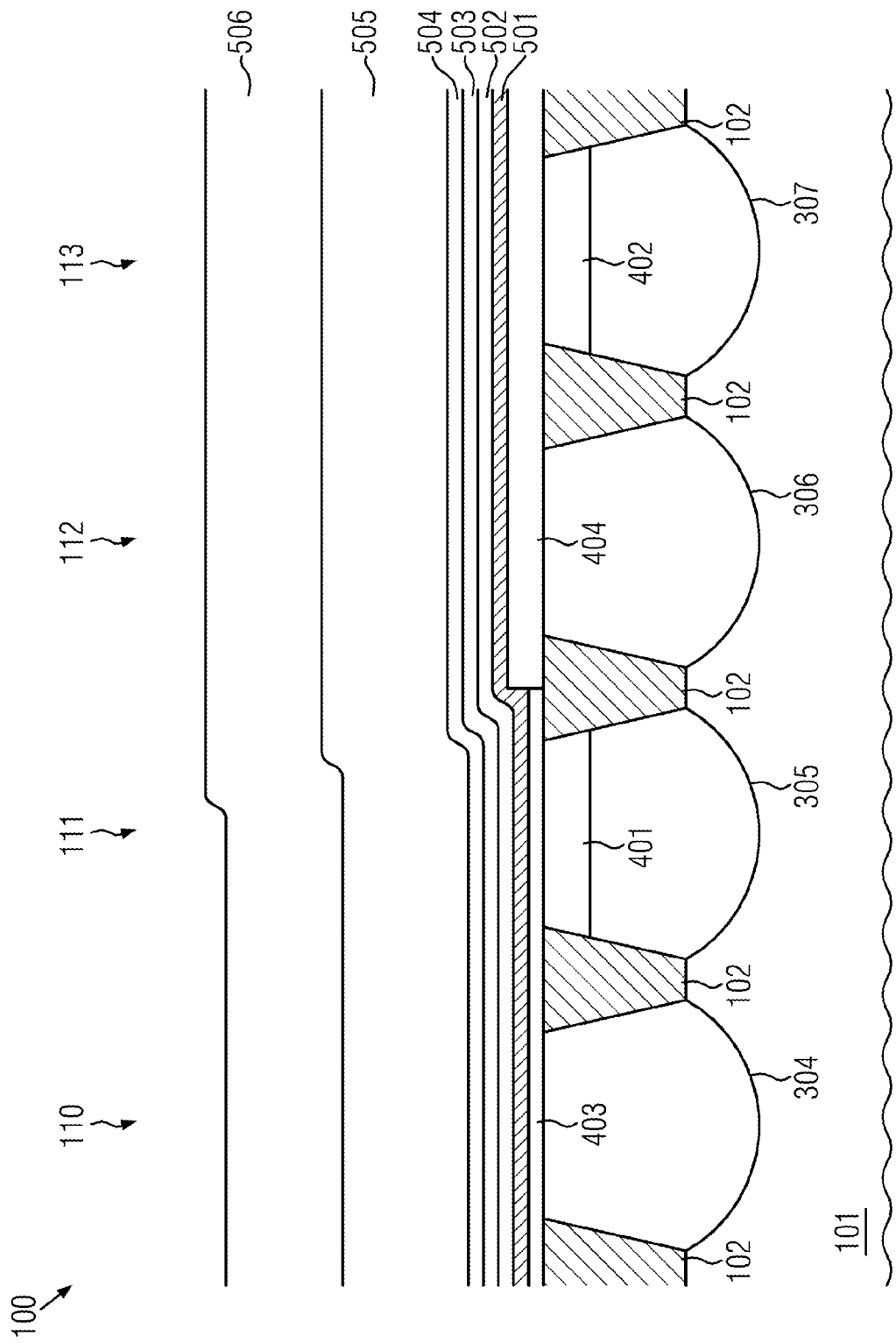

FIGS. 5a and 5b show schematic cross-sectional views of the semiconductor structure 100 in a later stage of the manufacturing process. After the formation of the dielectric layers 403, 404, electrically insulating layers 501, 502 may be deposited over the semiconductor structure 100 using processes of chemical vapor deposition and/or plasma-enhanced chemical vapor deposition. In some embodiments, the electrically insulating layer 501 may include silicon dioxide, silicon oxynitride and/or silicon nitride, and the electrically insulating layer 502 that is formed over the electrically insulating layer 501 may include a high-k material such as, for example, tantalum oxide, strontium titanium oxide, hafnium oxide, hafnium silicon oxide and/or zirconium oxide. Generally, in some embodiments, one or both of the electrically insulating layers may include a material having a greater dielectric constant than silicon dioxide, for example a dielectric constant greater than about four.

The present disclosure is not limited to embodiments wherein two electrically insulating layers 501, 502 are provided. In other embodiments, a single electrically insulating layer, for example a layer of a high-k material such as tantalum oxide, strontium titanium oxide, hafnium oxide, hafnium silicon oxide, zirconium oxide and the like, may be provided. In further embodiments, three or more electrically insulating layers may be provided, wherein at least one of the electrically insulating layers includes a high-k material.

After the formation of the electrically insulating layers 501, 502, electrically conductive layers 503, 504, 505 may be formed over the semiconductor structure 100. The electrically conductive layer 503 may be provided on the topmost one 502 of the electrically insulating layers 501, 502 and may include a metal such as, for example, lanthanum, lanthanum nitride, aluminum, aluminum nitride and/or titanium nitride. In some embodiments, portions of the electrically conductive layer 503 provided over P-channel transistor areas 109, 111, 113 and portions of the layer 503 provided over N-channel transistor areas 108, 110, 112 and the nonvolatile memory cell area 107 may be formed of different metals. For example, portions of the electrically conductive layer 503 over the nonvolatile memory cell area 107 and the N-channel transistor areas 108, 110, 112 may include lanthanum, lanthanum nitride and/or titanium nitride, and portions of the electrically conductive layer 503 over the P-channel transistor areas 109, 111, 113 may include aluminum and/or aluminum nitride.

The electrically conductive layer 504 may be, for example, a layer of titanium nitride, and may provide a cap layer of the electrically conductive layer 503. The electrically conductive layer 505, which may have a greater thickness than the layers 503, 504, may include polysilicon and may be doped for improving an electrical conductivity of the electrically conductive layer 505.

For forming the electrically conductive layers 503, 504, 505, deposition processes such as chemical vapor deposition, plasma enhanced chemical vapor deposition, physical vapor deposition and/or atomic layer deposition may be employed. In embodiments wherein the electrically conductive layer 503 includes portions of different materials, the portions of the electrically conductive layer 503 may be deposited subsequently, and processes of photolithography and etching may be employed for removing the portions of the electrically conductive layer 503 from parts of the semiconductor structure 100, in accordance with techniques for providing different metals in P-channel and N-channel transistors that are formed in accordance with high-k metal gate techniques.

On the electrically conductive layer 505, a dielectric layer 506, for example a layer of silicon dioxide, may be deposited. This may be done by means of deposition techniques such as chemical vapor deposition and/or plasma enhanced chemical vapor deposition.

Figure 6A:
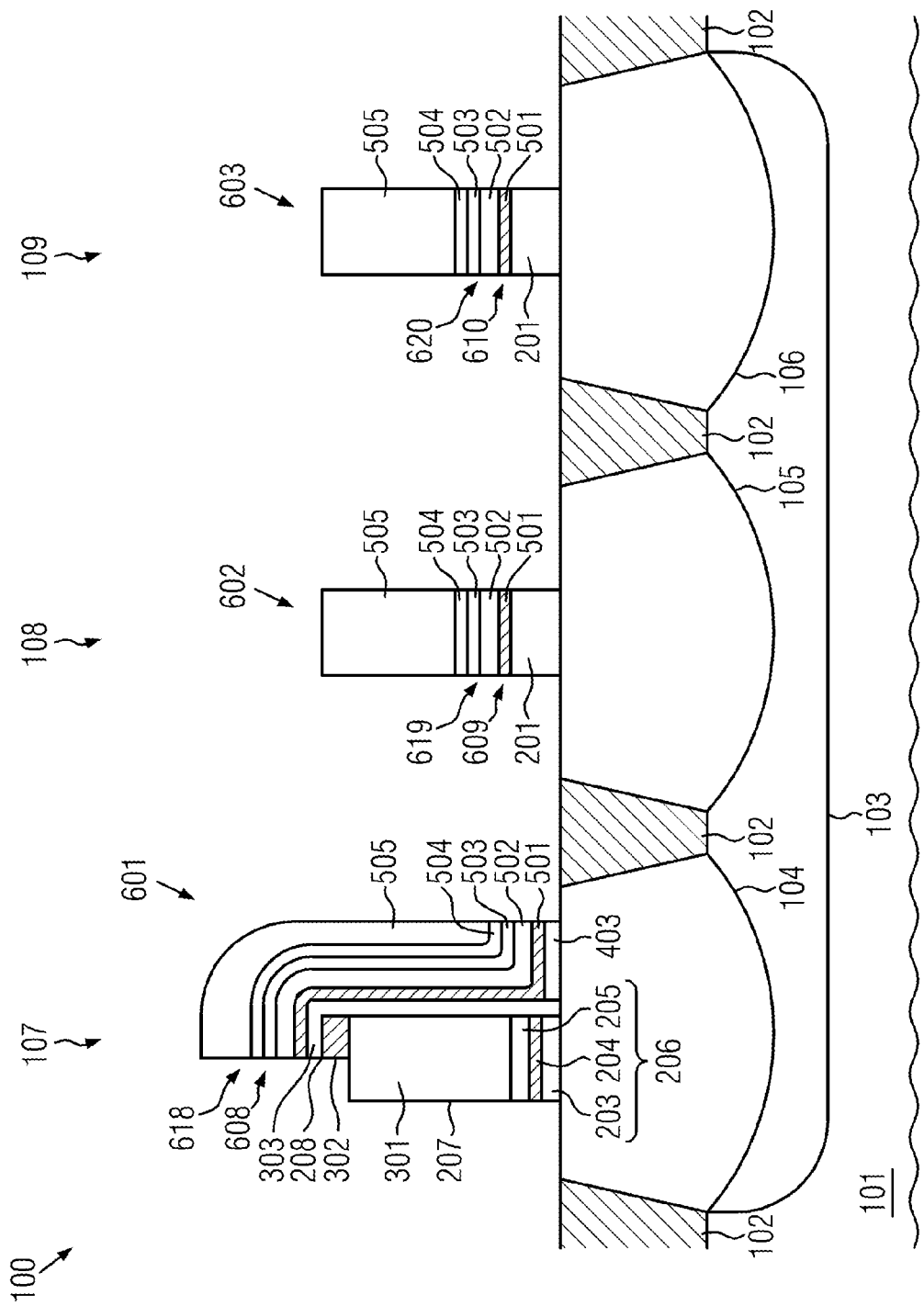
Figure 6B:
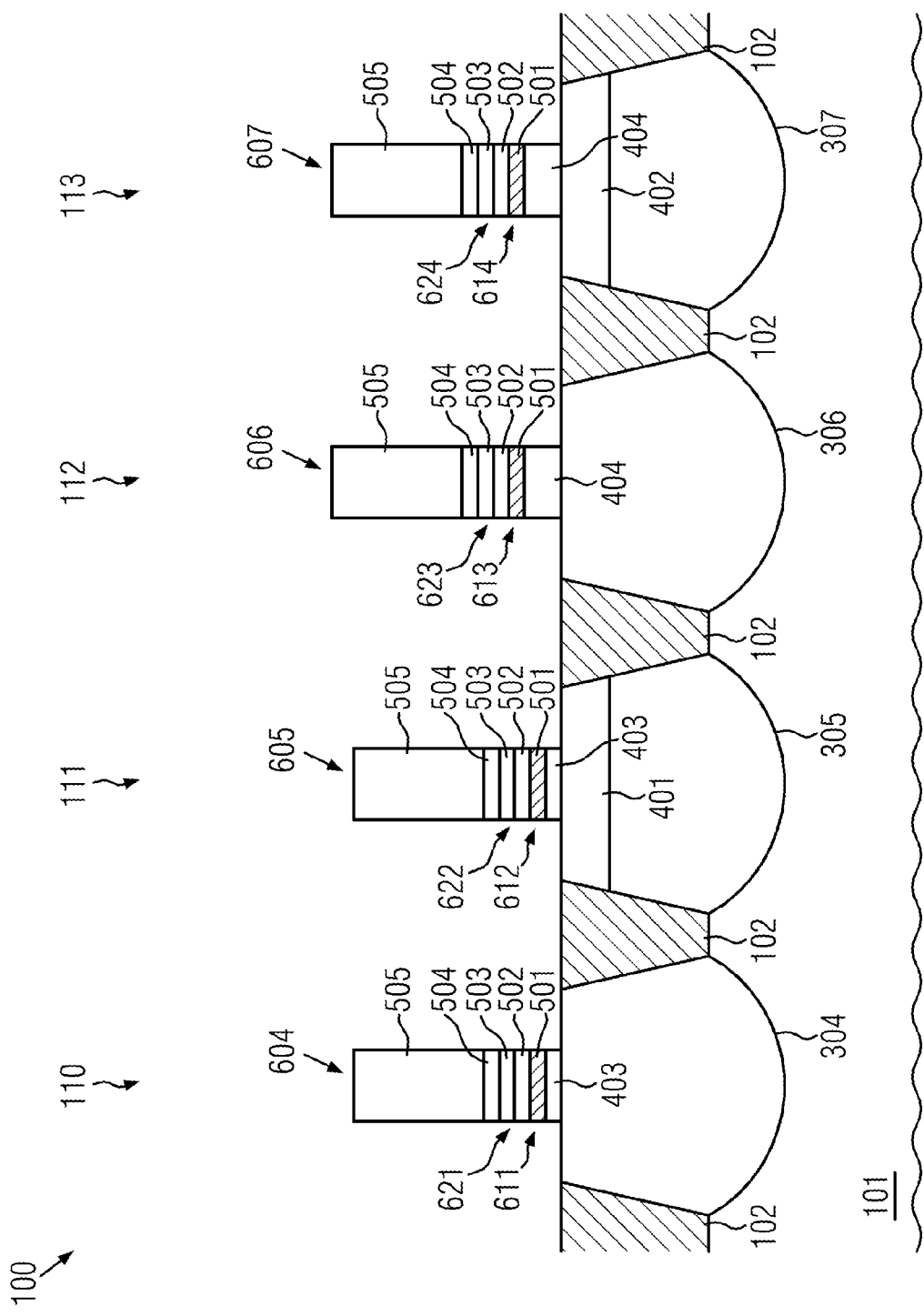

FIGS. 6a and 6b show schematic cross-sectional views of the semiconductor structure 100 in a later stage of the manufacturing process. After the formation of the electrically insulating layers 501, 502, the electrically conductive layers 503, 504, 505 and the dielectric layer 506, the electrically conductive layers 503, 504, 505 may be patterned. The dielectric layer 506 may be used in the patterning process, as will be detailed below. In this patterning process, a select gate electrode 601 and a select gate insulation layer 608 may be formed over the nonvolatile memory cell area 107, and transistor gate electrodes 602 to 607 as well as transistor gate insulation layers 609 to 614 may be formed over the transistor areas 108 to 113. The select gate electrode 601 and the transistor gate electrodes 602 to 607 are formed from portions of the electrically conductive layers 503 to 505.

The select gate insulation layer 608 includes a gate insulation layer arrangement 618 that is formed from portions of the electrically insulating layers 501, 502 that were formed over the nonvolatile memory cell area 107. Additionally, the select gate insulation layer 608 may include a portion of the dielectric layer 403.

The transistor gate insulation layers 609, 610 formed over the high voltage transistor areas 108, 109 may include respective gate insulation layer arrangements 619, 620 that are formed from portions of the electrically insulating layers 501, 502, and may additionally include portions of the dielectric layer 201. The gate insulation layers 611, 612 formed over the core transistor areas 110, 111 may each include a respective gate insulation layer arrangement 621, 622 formed from portions of the electrically insulating layers 501, 502, and may additionally include portions of the dielectric layer 403. The gate insulation layers 613, 614 formed over the input/output transistor areas 112, 113 may each include a respective gate insulation layer arrangement 623, 624 formed from portions of the electrically insulating layers 501, 502, and may additionally include portions of the dielectric layer 404.

Since each of the gate insulation layer arrangements 618 to 624 has been formed from portions of the electrically insulating layers 501, 502, the gate insulation layer arrangements 618 to 624 include corresponding sub-layers. In particular, each of the gate insulation layer arrangements 618 to 624 may include a first sub-layer formed from a portion of the electrically insulating layer 501 and a second sub-layer formed from a portion of the electrically insulating layer 502.

Accordingly, each of the gate insulation layer arrangements 619 to 624 of the gate insulation layers 609 to 614 formed over the transistor areas 108 to 113 may include a plurality of sub-layers, wherein for each of the sub-layers, there is a corresponding sub-layer in the gate insulation layer arrangement 618 of the select gate insulation layer 608.

In embodiments wherein a single electrically insulating layer is provided instead of the two electrically insulating layers 501, 502 as described above, each of the gate insulation layer arrangements 618 to 624 may include a single sub-layer provided by a portion of the single electrically insulating layer, wherein the sub-layers have corresponding features due to their formation from the same electrically insulating layer.

As detailed above, in some embodiments, portions of the electrically conductive layer 503 may be formed from different materials. Atoms from the electrically conductive layer 503 may diffuse into one or both of the electrically insulating layers 501, 502, and may form fixed charges therein. However, the portion of the electrically conductive layer 503 over the nonvolatile memory cell area 107 may have substantially the same composition as the portions of the electrically conductive layer 503 over one of the pair of high voltage transistor areas 108, 109, one of the pair of core transistor areas 110, 111 and one of the pair of input/output transistor areas 112, 113. In particular, the portion of the electrically conductive layer 503 over the nonvolatile memory cell area 107 may have substantially the same composition as portions of the electrically conductive layer 503 over the high voltage N-channel transistor area 108, the core N-channel transistor area 110 and the input/output N-channel transistor area 112. Thus, corresponding sub-layers of the gate insulation layer arrangements 618, 619, 621, 623 may have substantially the same material composition.

Due to their formation from portions of the electrically insulating layers 501, 502, the corresponding sub-layers of the gate insulation layer arrangements 618 to 624 may have substantially the same thickness, and the corresponding sub-layers are arranged in the same order in each of the gate insulation layer arrangements 618 to 624.

As can be seen from FIG. 6a, a portion of the gate insulation layer arrangement 618 of the select gate insulation layer 608 is arranged between the select gate electrode 601 and the control gate electrode 301. Thus, the gate insulation layer arrangement 618 may provide electrical insulation between the select gate electrode 601 and the control gate electrode 301. There is substantially no portion of the nonvolatile memory stack 206 between the control gate electrode 301 and the select gate electrode 601. Accordingly, electrical insulation between the select gate electrode 601 and the control gate electrode 301 may be provided independently of the nonvolatile memory stack 206.

For patterning the electrically insulating layers and the electrically conductive layers 503, 504, 505, processes of photolithography and etching may be employed, wherein a mask, for example a photoresist mask or a hardmask, is formed over the semiconductor structure 100, and one or more etch processes are performed for removing portions of the electrically insulating layers 501, 502 and the electrically conductive layers 503, 504, 505 which are not covered by the mask. In some embodiments, the patterning of the electrically insulating layers and the electrically conductive layers 503, 504, 505 may include a formation of a first mask and one or more first etching processes for forming the gate electrodes 602 to 607 and the gate insulation layers 609 to 614 over the transistor areas 108 to 113, and a formation of a second mask and one or more second etch processes for forming the select gate electrode 601 and the select gate insulation layer 608.

For protecting the portion of the electrically conductive layer 505 over the nonvolatile memory cell area 107 during the first etching process, the dielectric layer 506 described above may be used. Before forming the first mask and performing the first etch process that are employed for forming the transistor gate electrodes 602 to 607 and the transistor gate insulation layers 609 to 614, portions of the dielectric layer 506 over the transistor areas 108 to 113 may be removed, for example, by means of processes of photolithography and etching. A portion of the dielectric layer 506 over the nonvolatile memory cell area 107 may remain in the semiconductor structure during the first etch process. Since the select gate electrode 601 and the select gate insulation layer 608 are formed from portions of the electrically insulating layers 501, 502 and the electrically conductive layers 503, 504, 505 that are located on or close to the control gate electrode 301, the portions of the electrically insulating layers 501, 502 and the electrically conductive layers 503, 504, 505 from which the select gate insulation layer 608 and the select gate electrode 601 are formed may be located at a greater height above the substrate 101 than the portions of the electrically insulating layers 501, 502 and the electrically conductive layers 503, 504, 505 from which the gate insulation layers 609 to 614 and the gate electrodes 602 to 607 above the transistor areas 108 to 113 are formed. Employing a separate mask and one or more separate etch processes for the formation of the select gate insulation layer 608 and the select gate electrode 601 may help to overcome issues caused by the topography of the material layers from which the select gate insulation layer 608 and the select gate electrode 601 are formed and a limited depth of focus in photolithography processes that are employed for mask formation.

After the patterning of the electrically insulating layers 501, 502 and the electrically conductive layers 503, 504, 505, further process steps may be performed for forming source and drain extensions, halo regions, source and drain regions and sidewall spacers at each of the areas 107 to 113, in accordance with conventional process flows. Thus, a nonvolatile memory cell may be formed at the nonvolatile memory cell area 107, high voltage transistors may be formed at the high voltage transistor areas 108, 109, core transistors may be formed at the core transistor areas 110, 111 and input/output transistors may be formed at the input/output transistor areas 112, 113. Active regions of these circuit elements may be provided by the source and drain regions, and portions of the wells between the source and drain regions forming channel regions.

The present disclosure is not limited to embodiments wherein the select gate electrode 601 and gate electrodes 602 to 607 are formed before the formation of source and drain regions in the areas 107 to 113, in accordance with a gate first process, as described above with reference to FIGS. 1a to 6b. In other embodiments, a gate last process integration may be employed, as will be described in the following with reference to FIGS. 7a, 7b, 8a and 8b.

Figure 7A:
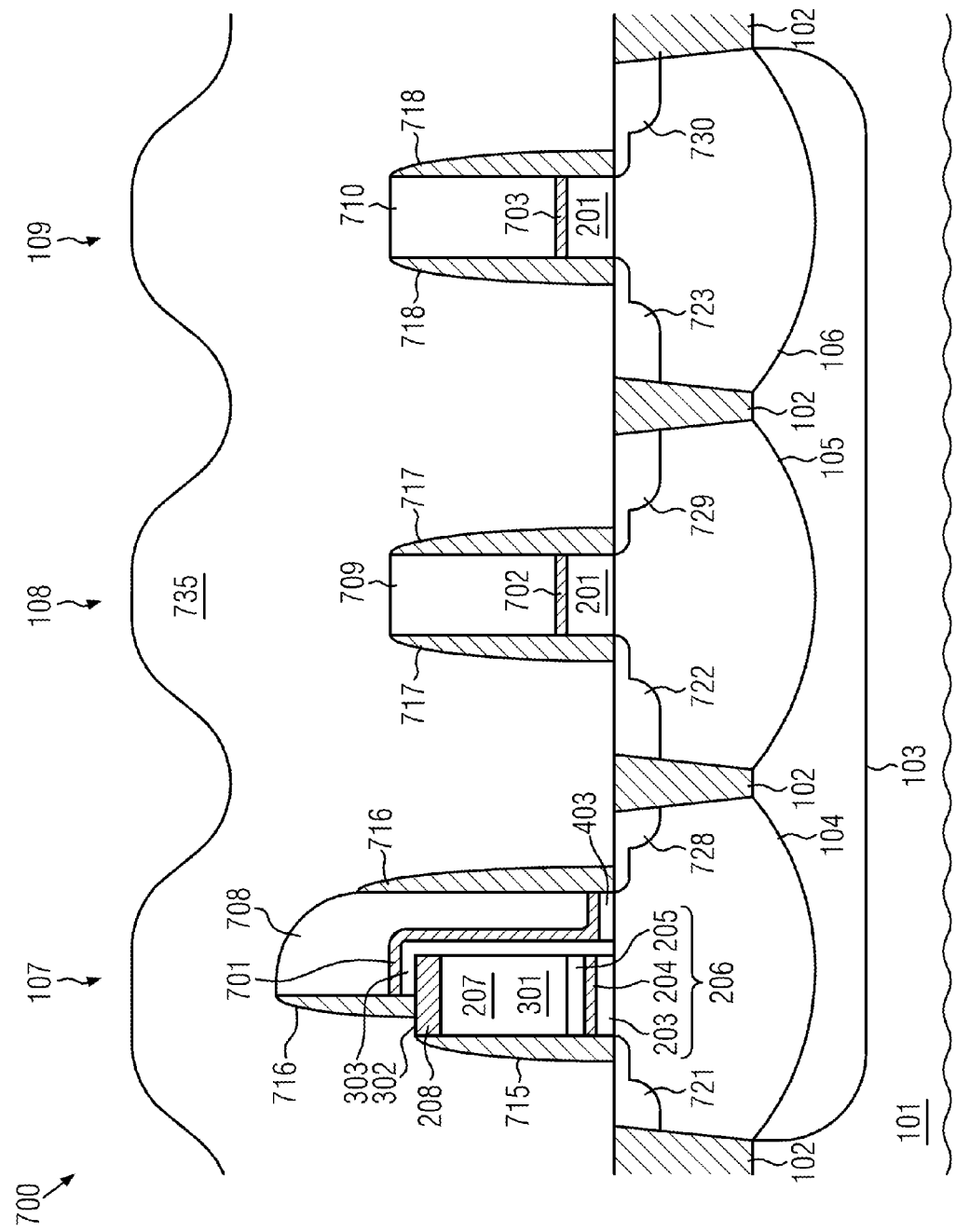
FIGS. 7a and 8a show schematic cross-sectional views of a first portion of a semiconductor structure according to an embodiment in stages of a method of manufacturing a semiconductor structure according to an embodiment.
Figure 7B:
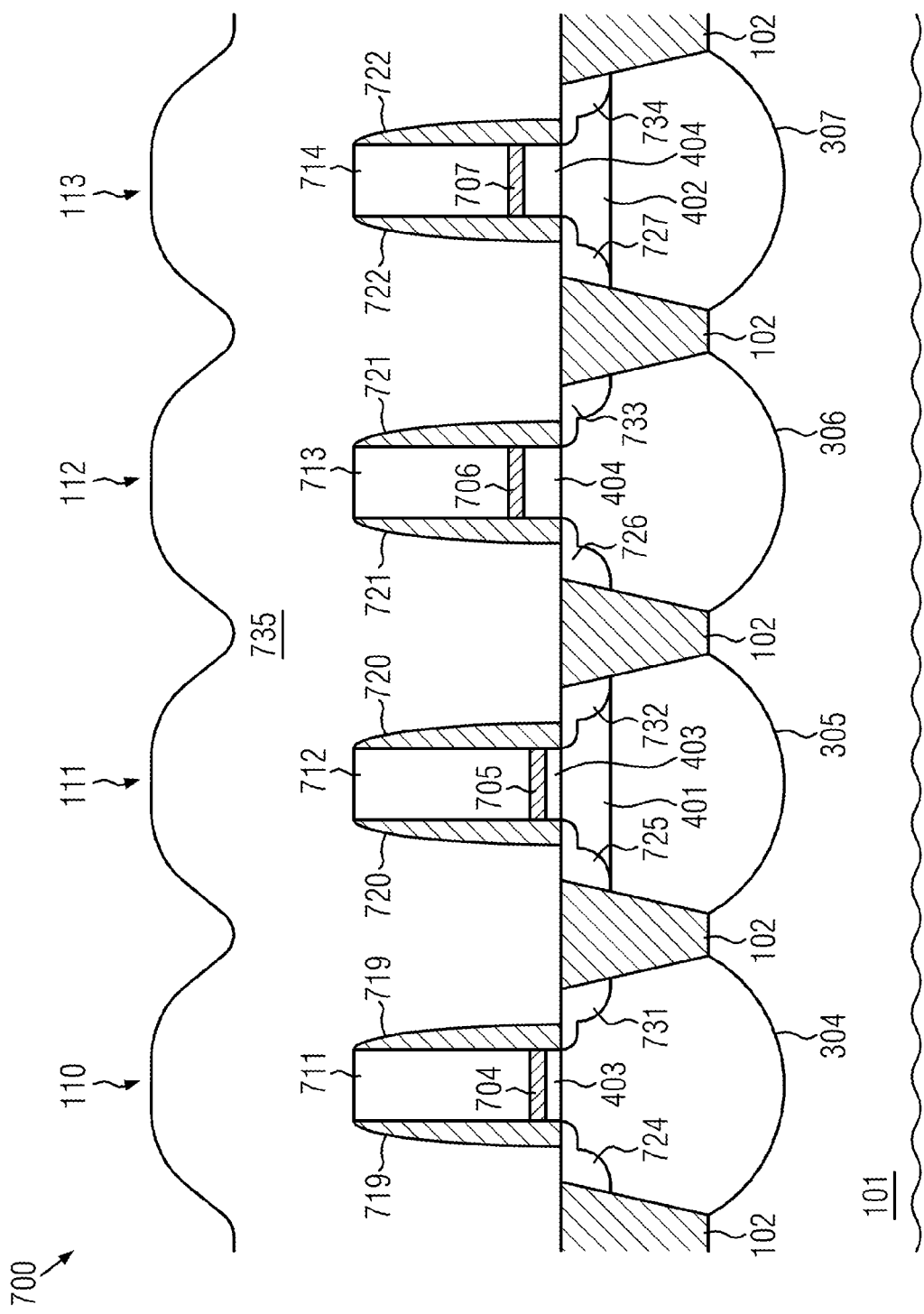
Figure 8A:
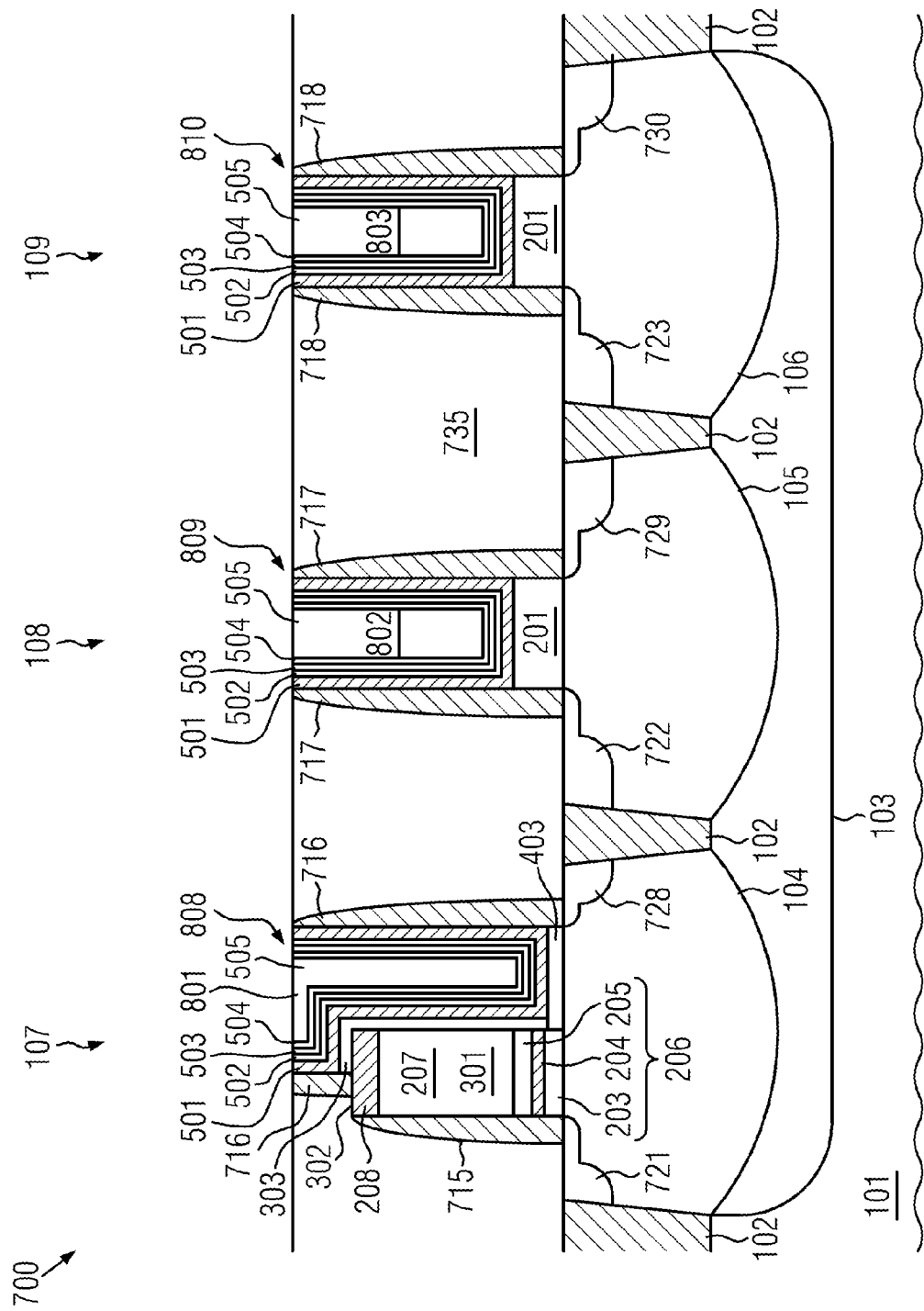
Figure 8B:
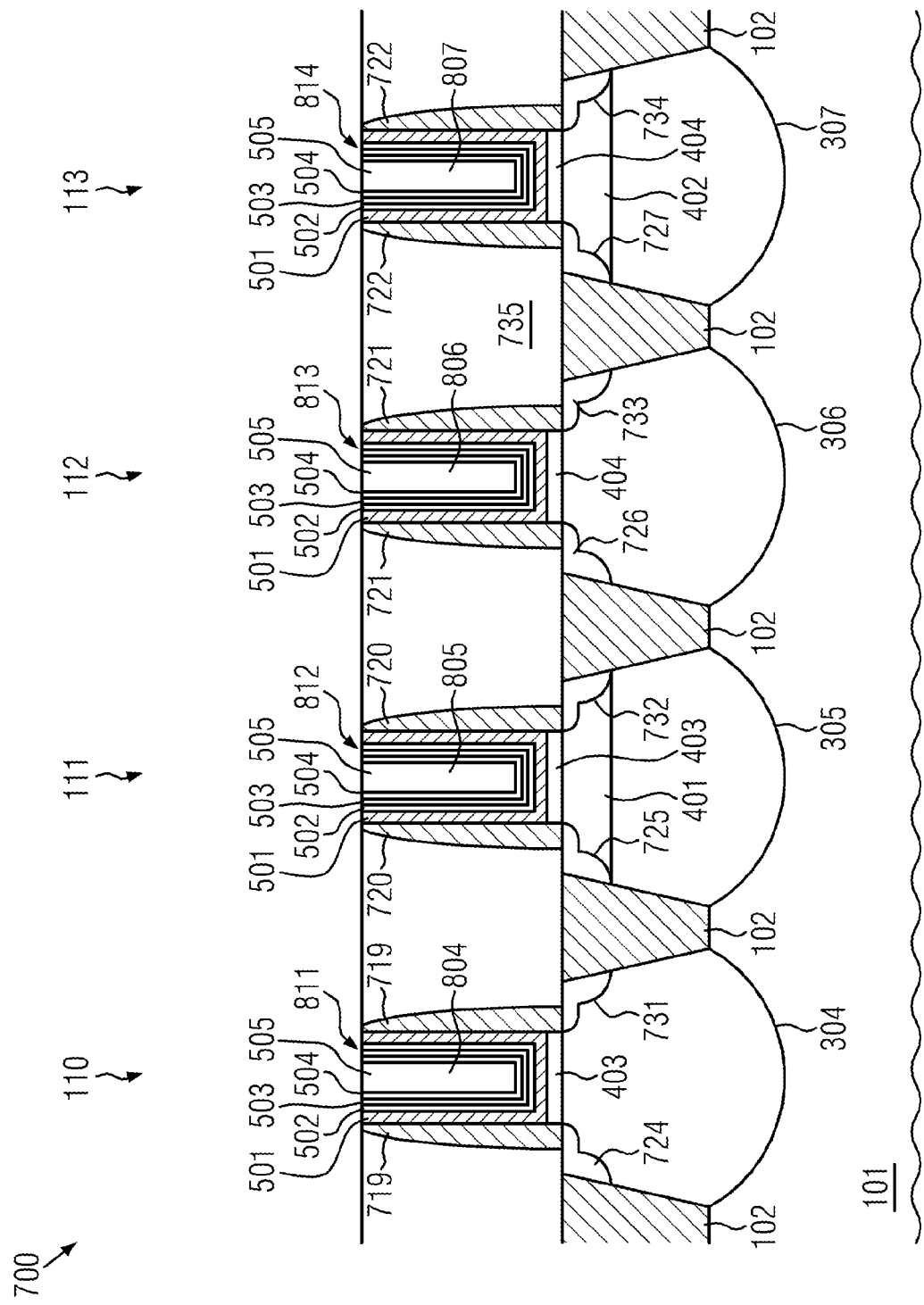

FIGS. 7a and 7b show schematic cross-sectional views of different portions of a semiconductor structure 700 according to an embodiment at a stage of a manufacturing process according to an embodiment. Schematic cross-sectional views of the portions of the semiconductor structure 700 shown in FIGS. 7a and 7b, respectively, at another stage of the manufacturing process are shown in FIGS. 8a and 8b, respectively. FIGS. 7a and 7b show the semiconductor structure 700 at a same point of the manufacturing process. FIGS. 8a and 8b show the semiconductor structure 700 at a same point of the manufacturing process that is later than the point of the manufacturing process shown in FIGS. 7a and 7b.

For convenience, in FIGS. 1a to 6b, and in FIGS. 7a to 8b, like reference numerals have been used to denote like components, and corresponding processes may be employed for the formation thereof, unless explicitly stated otherwise.

The semiconductor structure 700 may include a substrate 101. A trench isolation structure 102 may provide electrical insulation between a nonvolatile memory cell area 107, a high voltage N-channel transistor area 108, a high-voltage P-channel transistor area 109, a core N-channel transistor area 110, a core P-channel transistor area 111, an input/output N-channel transistor area 112, an input/output P-channel transistor area 113, and between the areas 107 to 113 and other areas of the semiconductor structure 700 wherein further circuit elements are formed (not shown).

In the substrate 101, a deep N-well 103 may be provided that includes the nonvolatile memory cell area 107, the high voltage N-channel transistor area 108 and the high voltage P-channel transistor area 109, but does not include the core N-channel transistor area 110, the core P-channel transistor area 111, the input/output N-channel transistor area 112 and the input/output P-channel transistor area 113.

In the nonvolatile memory cell area 107, a nonvolatile memory cell well 104 may be provided, in the high-voltage N-channel transistor area 108, a high voltage P-well 105 may be provided, and in the high-voltage P-channel transistor area 109, a high voltage N-well 106 may be provided. In the core N-channel transistor area 110, a core transistor P-well 304 may be provided, in the core P-channel transistor area 111, a core transistor N-well 305 may be provided, in the input/output N-channel transistor area 112, an input/output transistor P-well 306 may be provided, and in the input/output P-channel transistor area 113, an input/output transistor N-well 307 may be provided. The core P-channel transistor area 111 and the input/output P-channel transistor area 113 may further include a respective one of layers 401, 402 of stress-creating material.

Above the nonvolatile memory cell well 104, a nonvolatile memory stack 206 including a bottom isolation layer 203, a charge storage layer 204 and a top isolation layer 205 may be provided. Above the nonvolatile memory stack 206, a control gate electrode 301 covered by a cap layer 302 may be provided. Additionally, dielectric layers 201, 303, 403, and 404 may be provided.

The above-described features may be formed as described as above with reference to FIGS. 1a to 4b, wherein the dielectric layer 403 may initially cover the surface of the nonvolatile memory cell well 104 adjacent the control gate electrode 301 and the core transistor wells 304, 305, the dielectric layer 404 may initially cover the input/output transistor wells 306, 307, and the dielectric layer 201 may initially cover the surface of the high voltage transistor wells 105, 106.

A dummy select gate electrode 708 and a dummy select gate insulation layer 701 may be formed over the nonvolatile memory cell area 107, and dummy transistor gate electrodes 709 to 714 and dummy transistor gate insulation layers 702 to 707 may be formed over the transistor areas 108 to 113.

This can be done by depositing a layer of the material of the dummy select gate insulation layer 701 and the dummy transistor gate insulation layers 702 to 707, for example a layer of silicon dioxide, and a layer of a material of the dummy select gate electrode 708 and the dummy transistor gate electrodes 709 to 714, for example a layer of polysilicon, over the semiconductor structure 700, for example, by means of processes of chemical vapor deposition and/or plasma enhanced chemical vapor deposition. These layers, and the dielectric layers 201, 303, 403, 404, may be patterned by means of processes of photolithography and etching, wherein first processes of photolithography and etching may be performed for forming the dummy transistor gate insulation layers 702 to 707 and the dummy transistor gate electrodes 709 to 714, and second processes of photolithography and etching may be performed for forming the dummy select gate insulation layer 701 and the dummy select gate electrode 708, similar to the formation of the select gate electrode 601, the transistor gate electrodes 602 to 607, the select gate insulation layer 608 and the transistor gate insulation layers 609 to 614 described above with reference to FIGS. 6a and 6b.

Thereafter, ion implantation processes may be performed for forming source and drain extensions and, optionally, halo regions in each of the nonvolatile memory cell area 107 and the transistor areas 108 to 109. Then, sidewall spacers 715 to 722 may be formed at the sidewalls of each of the control gate electrode 301, the dummy select gate electrode 708 and the dummy transistor gate electrodes 709 to 714. This may be done by depositing a layer of a material of the sidewall spacers 715 to 722 over the semiconductor structure 700. The layer of sidewall spacer material may include, for example, silicon nitride. Then, an anisotropic etch process may be performed for removing portions of the layer of sidewall spacer material from substantially horizontal or weakly inclined portions of the surface of the semiconductor structure 700, whereas, due to the anisotropy of the etch process, portions of the layer of sidewall spacer material at the sidewalls of the control gate electrode 301, the dummy select gate electrode 708 and the dummy transistor gate electrodes 709 to 714 remain in the semiconductor structure 700 and form the sidewall spacers 715 to 722.

Then, ion implantation processes may be performed for forming source regions 721 to 727 and drain regions 728 to 734 in the nonvolatile memory cell well 104 and the transistor wells 105, 106 and 304 to 307.

Thereafter, a layer 735 of an interlayer dielectric, for example a layer of silicon dioxide, may be deposited over the semiconductor structure 700.

FIGS. 8a and 8b show schematic cross-sectional views of the semiconductor structure 700 in a later stage of the manufacturing process. After the formation of the interlayer dielectric 735, a chemical mechanical polishing process may be performed. In the chemical mechanical polishing process, the surface of the semiconductor structure 700 may be planarized. Moreover, the dummy select gate electrode 708 and the dummy transistor gate electrodes 709 to 714 may be exposed at the surface of the semiconductor structure 700.

Then, one or more etch processes may be performed for removing the dummy select gate electrode 708, the dummy transistor gate electrodes 709 to 714, the dummy select gate insulation layer 701 and the dummy transistor gate insulation layers 702 to 707. Then, electrically insulating layers 501, 502 and electrically conductive layers 503, 504, 505 may be deposited over the semiconductor structure 700, and a further chemical mechanical polishing process may be performed for removing portions of these layers that were deposited on the surface of the interlayer dielectric 735. Portions of the electrically insulating layers 501, 502 and the electrically conductive layers 503, 504, 505 deposited at the locations of the dummy select gate electrode 708 and the dummy transistor gate electrodes 709 to 714 may remain in the semiconductor structure 700 and may form a select gate insulation layer 808, a select gate electrode 801, transistor gate insulation layers 809 to 814 and transistor gate electrodes 802 to 807 having features similar to those of the select gate electrode 601, the select gate insulation layer 608, the transistor gate electrodes 602 to 607 and the transistor gate insulation layers 609 to 617 described above with reference to FIGS. 6a and 6b.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor structure;
   forming a first well region in said semiconductor structure;
   forming a second well region in said semiconductor structure;
   forming a nonvolatile memory stack and a control gate electrode above said first well region;
   forming a first layer of dielectric material over said semiconductor structure and removing a first portion of said first layer of dielectric material above a location of said first well region, wherein a second portion of said first layer of dielectric material over a location of said second well region is not removed;
   after removing said first portion of said first layer of dielectric material, forming one or more electrically insulating layers over said semiconductor structure, wherein at least one of said electrically insulating layers comprises a high-k dielectric material;

after the formation of said one or more electrically insulating layers, forming one or more electrically conductive layers over said semiconductor structure, wherein at least one of said one or more electrically conductive layers comprises a metal;

forming a select gate insulation layer and a select gate electrode that are provided at least partially above said first well region adjacent to said nonvolatile memory stack; and forming a transistor gate insulation layer and a transistor gate electrode above said second well region;

wherein said select gate insulation layer is at least partially formed from said one or more electrically insulating layers, said transistor gate insulation layer is at least partially formed from said second portion of said first layer of dielectric material and said one or more electrically insulating layers; and wherein said select gate electrode and said transistor gate electrode are at least partially formed from said one or more electrically conductive layers.

2. The method of claim 1, wherein the formation of said first layer of dielectric material and the removal of said portion of said first layer of dielectric material over said location of said first well region are performed before the formation of said nonvolatile memory stack and said control gate electrode.

3. The method of claim 1, further comprising:
forming a third well region in said semiconductor structure; and
forming a second transistor gate insulation layer and a second transistor gate electrode over said third well region, wherein said second transistor gate insulation layer is at least partially formed from said one or more electrically insulating layers and said second transistor gate electrode is at least partially formed from said one or more electrically conductive layers, and wherein a portion of said first layer of dielectric material over a location of said third well region is removed before the formation of said one or more electrically insulating layers.

4. The method of claim 3, further comprising, before forming said one or more layers of electrically insulating material, forming a second dielectric layer over said location of said first well region and said location of said third well region, wherein a thickness of said second dielectric layer is smaller than a thickness of said first dielectric layer.

5. The method of claim 4, further comprising:
forming a fourth well region in said semiconductor structure; and
forming a third transistor gate insulation layer and a third transistor gate electrode over said fourth well region, wherein said third transistor gate insulation layer is at least partially formed from said one or more electrically insulating layers and said third transistor gate electrode is at least partially formed from said one or more electrically conductive layers, and wherein a portion of said first dielectric layer over a location of said fourth well region is removed before the formation of said one or more electrically insulating layers.

6. The method of claim 5, further comprising, before forming said one or more layers of electrically insulating material, forming a third dielectric layer over a location of said fourth well region, wherein a thickness of said third dielectric layer is smaller than the thickness of said first dielectric layer and greater than the thickness of said second dielectric layer.

7. The method of claim 6, wherein said second dielectric layer and said third dielectric layer are formed after the formation of said nonvolatile memory stack and said control gate electrode.

8. The method according to claim 7, further comprising:
forming a split gate nonvolatile memory cell from said first well region, said nonvolatile memory stack, said control gate electrode, said select gate insulation layer and said select gate electrode;
forming a high voltage transistor from said second well region, said first transistor gate insulation layer and said first transistor gate electrode;
forming a core transistor of a logic circuit from said third well region, said second transistor gate insulation layer and said second transistor gate electrode; and
forming an input/output transistor of a logic circuit from said fourth well region, said third transistor gate insulation layer and said third transistor gate electrode.

9. The method of claim 1, wherein the formation of said select gate insulation layer, said select gate electrode, said transistor gate insulation layer and said transistor gate electrode comprises patterning said one or more electrically insulating layers and said one or more electrically conductive layers by means of one or more processes of photolithography and etching.

10. The method of claim 1, further comprising:
forming a dummy select gate electrode over said first well region adjacent to said nonvolatile memory stack;
forming a dummy transistor gate electrode over said second well region;
after the formation of said dummy select gate electrode and said dummy transistor gate electrode, forming a layer of an interlayer dielectric over said semiconductor structure;
performing a first polishing process that exposes said dummy select gate electrode and said dummy transistor gate electrode; and
after said first polishing process, removing said dummy select gate electrode and said dummy transistor gate electrode;
wherein the formation of said one or more electrically insulating layers and the formation of said one or more electrically conductive layers are performed after the removal of said dummy select gate electrode and said dummy transistor gate electrode; and
wherein the formation of said select gate insulation layer, said select gate electrode, said transistor gate insulation layer and said transistor gate electrode comprises performing a second polishing process that removes portions of said one or more electrically insulating layers and said one or more electrically conductive layers that are provided above said layer of the interlayer dielectric.

11. The method of claim 8, wherein said third well region and said fourth well region are formed after the formation of said nonvolatile memory stack and said control gate electrode.

12. The method of claim 11, further comprising forming a stress-creating material in said second active region prior to forming said first layer of dielectric material.

13. The method of claim 3, further comprising forming a stress-creating material in said third well region prior to forming said first layer of dielectric material.

14. A method, comprising:
providing a semiconductor structure;
forming a first well region in said semiconductor structure;
forming a second well region in said semiconductor structure;

forming a nonvolatile memory stack and a control gate electrode above said first well region;

forming a dummy select gate electrode over said first well region adjacent to said nonvolatile memory stack;

forming a dummy transistor gate electrode over said second well region;

after the formation of said dummy select gate electrode and said dummy transistor gate electrode, forming a layer of an interlayer dielectric over said semiconductor structure;

performing a first polishing process that exposes said dummy select gate electrode and said dummy transistor gate electrode;

after said first polishing process, removing said dummy select gate electrode and said dummy transistor gate electrode;

after the removal of said dummy select gate electrode and said dummy transistor gate electrode, forming one or more electrically insulating layers over said semiconductor structure, wherein at least one of said electrically insulating layers comprises a high-k dielectric material;

after the formation of said one or more electrically insulating layers, forming one or more electrically conductive layers over said semiconductor structure, wherein at least one of said one or more electrically conductive layers comprises a metal;

performing a second polishing process that removes portions of said one or more electrically insulating layers and said one or more electrically conductive layers that are provided above said layer of the interlayer dielectric;

forming a select gate insulation layer and a select gate electrode that are provided at least partially above said first well region adjacent to said nonvolatile memory stack; and forming a transistor gate insulation layer and a transistor gate electrode above said second well region, wherein said select gate insulation layer and said transistor gate insulation layer are at least partially formed from said one or more electrically insulating layers and said select gate electrode and said transistor gate electrode are at least partially formed from said one or more electrically conductive layers.

* * * * *